United States Patent
Fukuzawa et al.

[11] Patent Number: 6,118,624
[45] Date of Patent: *Sep. 12, 2000

[54] MAGNETO-RESISTANCE EFFECT ELEMENT HAVING A MAGNETIC BIASING FILM

[75] Inventors: Hideaki Fukuzawa, Sagamihara; Yuzo Kamiguchi, Yokohama; Hitoshi Iwasaki, Yokosuka, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/069,163

[22] Filed: Apr. 29, 1998

[30]  Foreign Application Priority Data

May 7, 1997 [JP] Japan .................................. 9-117235

[51] Int. Cl.⁷ ....................................................... G11B 5/39
[52] U.S. Cl. .................................................... 360/113
[58] Field of Search ........................................... 360/113

[56]  References Cited

U.S. PATENT DOCUMENTS

| | | |
|---|---|---|
| 4,639,806 | 1/1987 | Kira et al. . |
| 4,771,349 | 9/1988 | Tsang . |
| 5,018,037 | 5/1991 | Krounbi et al. . |
| 5,434,826 | 7/1995 | Ravipati et al. . |
| 5,549,978 | 8/1996 | Iwasaki et al. . |
| 5,654,854 | 8/1997 | Mallary . |
| 5,733,370 | 3/1998 | Chen et al. . |
| 5,742,162 | 4/1998 | Nepela et al. . |
| 5,748,416 | 5/1998 | Tobise et al. . |
| 5,867,351 | 2/1999 | Gill . |
| 5,876,843 | 3/1999 | Ishiwata . |
| 5,883,764 | 3/1999 | Pinarbasi .................................. 360/113 |
| 5,896,251 | 4/1999 | Ohsawa et al. . |
| 5,923,503 | 7/1999 | Sato et al. . |
| 5,936,810 | 8/1999 | Nakamoto et al. . |

FOREIGN PATENT DOCUMENTS

| | | |
|---|---|---|
| 0 768 643 | 4/1997 | European Pat. Off. . |
| 4-245011 | 9/1992 | Japan . |
| 7-182629 | 7/1995 | Japan . |
| 9-97409 | 4/1997 | Japan . |

OTHER PUBLICATIONS

Gao et al., "Correlation of bulk saturation magnetization with signal–to–media–noise ratio of Co–Cr–(Pt)–ta alloy thin film disks," Journal of Magnetism and Magnetic Materials (1999), pp. 253–257.

(List continued on next page.)

*Primary Examiner*—A. J. Heinz
*Attorney, Agent, or Firm*—Finnegan, Henderson, Farabow, Garrett & Dunner, L.L.P.

[57]  ABSTRACT

A spin valve GMR element comprises a spin valve GMR film stacked in turn a pinned layer, a non-magnetic layer, and a free layer of which magnetization direction varies according to an external magnetic field, and a magnetic biasing film providing a bias magnetic field to the free layer. A spin valve GMR film can be a dual element type. A magnetic biasing film has a stacked film of a high saturation magnetization magnetic layer and a hard magnetic layer. The high saturation magnetization magnetic layer has saturation magnetization $Ms^{high}$ which, when saturation magnetization of the free layer is $Ms^{free}$ and saturation magnetization of the hard magnetic layer is $Ms^{hard}$, satisfies at least one of $Ms^{high} \geq Ms^{free}$ or $Ms^{high} \geq Ms^{hard}$. In a spin valve GMR head of a reversed structure or a dual element type, even when a track width is narrowed, occurrence of Barkhausen noise can be effectively suppressed.

21 Claims, 25 Drawing Sheets

OTHER PUBLICATIONS

Choe et al., "High coercivity CoPtCr, CoPt films deposited at high power and high bias conditions for hard bias applications in magnetoresistive heads," J. Appl. Phys. (Apr. 15, 1997), 81:4894–96.

Abarra et al., "Magnetic Force Microscopy Analysis of Thermal Stability in 8 Gbit/in$^2$ Longitudinal Recording Media,"Journal of the Magnetics Society of Japan (1997), pp. 291–296.

Yoda et al., "Dual–Element GMR/Inductive heads for Gigabits Density Recording Using Cofe Spin–Valves," IEEE Transactions on Magnetics (Sep. 1996), 32:3363–67.

Zhu et al., "Impact of Microstructure on Stability of Permanent Magnet Biased Magnetoresistive Heads,"IEEE Transactions of Magnetic (Jan 1996), 32:54–60.

Tadokoro et al., "Magnetic properties of FeCr/CoCrPt hard magnetic films," Proceedings of the 20$^{th}$ Japanese Applied-Magnetism Society (1996), p. 364.

Zhu et al., "Effect of In–Plane Easy Axis Orientation in Narrow Track Recording," IEEE Transactions on Magnetics (Jan. 1993), 29:324–329.

PRIOR ART

MAGNETO-RESISTANCE EFFECT ELEMENT HAVING A MAGNETIC BIASING FILM

BACKGROUND OF THE INVENTION

1. Field of the Invention

The present invention relates to a magneto-resistance effect element, and a magnetic head and magnetic read apparatus both of which use that element.

2. Description of the Related Art

In a magnetic recording apparatus such as a HDD, to improve recording density, narrowing of a recording track width of a read medium is under way. To compensate decrease of read output power accompanying this narrowing of a recording track width, demand for a magnetic head provided with a high sensitive magneto-resistance effect element (MR element) is becoming large. In particular, an MR head possessing a spin valve film consisting of a magnetic multi-layered film having a ferromagnetic layer of which magnetization rotates according to a signal magnetic field (hereinafter refer to as a free layer), a non-magnetic layer, a ferromagnetic layer of which magnetization is pinned (hereinafter referred to as a pinned layer), and an antiferromagnetic layer for pinning the magnetization of the pinned layer, and showing a giant magneto-resistance effect is seen as a potential candidate.

In an MR head using a spin valve film, Barkhausen noise caused by discontinuous movement of Bloch wall of a free layer is a big problem in putting to practical use. To circumvent such a problem, an MR head of a so-called abutted junction structure is proposed, wherein, as shown in FIG. 44, outsides of both edge portions off a recording track width $W_t$ of a spin valve film 1 are etched away to eliminate and thereon hard magnetic layers 2 are respectively disposed as hard magnetic biasing films.

As another MR head, as shown in FIG. 45, a so-called overlaid structure is proposed as a bias magnetic field inputting film, wherein, on a pair of hard magnetic layers 2, outside portions of the both edge portions of a spin valve film 1 are at least stacked. A pair of hard magnetic layers 2 are disposed in advance in a region off a recording track width $W_t$ of a spin valve film 1.

In an MR head in which the above described bias structure is applied, by removing Bloch wall of the free layer 3 with a bias magnetic field from a hard magnetic layer 2, occurrence of Barkhausen noise is suppressed. Here, in each spin valve MR head shown in FIG. 44 and FIG. 45, a spin valve film 1 is fundamentally consisting of a free layer 3, a non-magnetic layer 4, a pinned layer 5, and an antiferromagnetic layer 6. On a hard magnetic layer 2 (FIG. 44) or on a spin valve film 1 (FIG. 45), a pair of electrodes 7 for supplying a sense current to a spin valve film 1 are formed.

A spin valve film 1 is interposed between a pair of upper and lower magnetic shield layers 9a, 9b disposed respectively through a magnetic gap films 8a, 8b. These constitute a shield type MR head. In addition, for enhancing sensitivity of a spin valve film 1, as a constituent material of a free layer 3 and a pinned layer 5, a ferromagnetic material containing Co such as a CoFe alloy is effective.

Now, to respond to further high densification of magnetic recording density, even in a spin valve MR head, further gap narrowing (thinning of magnetic gap films 8a, 8b) is being demanded. When the above described bias structure is applied in such a narrow gapped MR head, there is a problem that effective bias power can not be obtained. That is, even if it is tried to enhance the bias force by increasing a film thickness of a hard magnetic layer 2 as a hard magnetic biasing film, since the bias magnetic field leaks to the magnetic shield layers 9a, 9b, effective bias force can not be obtained.

Further, recently, to attain stabilization of a pinned layer or improvement of off-track characteristics thereof, a spin valve film of a reversed structure in which positions of a free layer 3 and a pinned layer 5 are reversed is proposed. In a spin valve film of a reversed structure, antiferromagnetic layer/pinned layer/non-magnetic layer/free layer are stacked in turn from a substrate side. Further, to attain high sensitivity of an MR head, a dual element spin valve film having 2 of free layer or pinned layer is proposed. In the MR heads using these spin valve films, it is becoming particularly difficult to input effectively a bias magnetic field to a free layer.

Besides, concerning a structure of a spin valve film, a hard magnetic film is proposed to be applied in a pinned layer. However, a spin valve film using a conventional hard magnetic film, since magnetization directions of the hard magnetic film are not aligned to the film plane, there is a problem that influence of ferromagnetic coupling through a non-magnetic layer becomes large. If the influence of the ferromagnetic coupling becomes large, it adversely affect on magnetization behavior of a free layer.

A spin valve film is also being investigated to use as a magneto-resistance effect memory such as an MRAM, for example. A hard magnetic film is being studied to be used as a ferromagnetic layer in which information of such a magneto-resistance effect memory is memorized. However, a conventional hard magnetic film has caused performance deterioration as a spin valve film.

As described above, in an MR element using a spin valve film, an abutted junction structure or an overlaid structure employing a hard magnetic biasing film is fundamentally effective in suppression of Barkhausen noise due to domain wall of a free layer. However, by narrowing a gap or a track of an MR head, it is becoming difficult to effectively input a bias magnetic field to a free layer.

In particular, in an MR head in which a spin valve film of a reversed structure or a spin valve film of a dual element type structure is employed, since a position of the free layer is different from the conventional spin valve film, it is difficult, in a conventional bias structure, to input effectively a bias magnetic field.

Further, in a conventional spin valve film in which a hard magnetic film is used as a constituent element, since magnetization directions of the hard magnetic film are not aligned to the film plane, there is a problem that it is difficult to obtain characteristics capable of being putted to practical use as an MR head or an MRAM.

SUMMARY OF THE INVENTION

Therefore, an objective of the present invention, by enabling to input effectively a bias magnetic field to a magneto-resistance effect film of various kinds of structure, is to provide a magneto-resistance effect element which enables to suppress effectively occurrence of Barkhausen noise when, for example, a track width is made narrow. Another objective of the present invention, by reducing influence of ferromagnetic coupling between free layer and pinned layer employing a hard magnetic film, is to provide a magneto-resistance effect element which enables to obtain an excellent characteristics. Still another objective of the present invention, by employing a magneto-resistance effect element such as described above, is, together with to attain to respond to high recording densification, to provide a magnetic head and a magnetic memory device of which characteristics are improved.

A first magneto-resistance effect element of the present invention comprises a magneto-resistance effect film having a pinned layer, a non-magnetic layer stacked on the pinned layer thereabove, and a free layer stacked on the non-magnetic layer thereabove and varying its magnetization direction by an external magnetic field, a magnetic biasing film for providing a bias magnetic field to the free layer, wherein the magnetic biasing film has a stacked film of a hard magnetic layer and a high saturation magnetization magnetic layer, and, when saturation magnetization of the high saturation magnetization magnetic layer is $Ms^{high}$, saturation magnetization of the free layer is $Ms^{free}$, saturation magnetization of the hard magnetic layer is $Ms^{hard}$, the high saturation magnetization magnetic layer satisfies at least one of $Ms^{high} \geq Ms^{free}$ and $Ms^{high} \geq Ms^{hard}$, and an electrode providing a sense current to the magneto-resistance effect film.

A second magneto-resistance effect element of the present invention comprises a magneto-resistance effect film which has a magnetic multi-layered film comprising a plurality of magnetic layers and a plurality of non-magnetic layers each disposed between the plurality of magnetic layers, at least one layer among the plurality of magnetic layers being a free layer of which magnetization direction varies according to an external magnetic field, at least one layer being a pinned layer, a magnetic biasing film for providing a bias magnetic field to the free layer, wherein the magnetic biasing film has a stacked film of a hard magnetic layer and a high saturation magnetization magnetic layer, and, when saturation magnetization of the high saturation magnetization magnetic layer is $Ms^{high}$, saturation magnetization of the free layer is $Ms^{free}$, saturation magnetization of the hard magnetic layer is $Ms^{hard}$, the high saturation magnetization magnetic layer satisfies at least one of $Ms^{high} \geq Ms^{free}$ and $Ms^{high} \geq Ms^{hard}$, and an electrode providing a sense current to the magneto-resistance effect film.

In the second magneto-resistance effect element, as a specific structure of a magneto-resistance effect film, a structure having a first pinned layer, the free layer stacked on the first pinned layer through a first non-magnetic layer, and a second pinned layer stacked on the free layer through the second non-magnetic layer, or a structure having a first free layer, the pinned layer stacked on the first free layer through a first non-magnetic layer, and a second free layer stacked on the pinned layer through a second non-magnetic layer can be cited.

A third magneto-resistance effect element of the present invention comprises a magneto-resistance effect film having a magnetic layer displaying an anisotropic magneto-resistance effect and a soft magnetic layer stacked with the magnetic layer through a non-magnetic layer and providing an operating point bias to the magnetic layer, a magnetic biasing film for providing a bias magnetic field to the magnetic layer which displays anisotropic magneto-resistance effect or the soft magnetic layer, wherein the magnetic biasing film has a stacked film of a hard magnetic layer and a high saturation magnetization magnetic layer, and, when saturation magnetization of the high saturation magnetization magnetic layer is $Ms^{high}$, saturation magnetization of the magnetic layer which displays the anisotropic magneto-resistance effect is $Ms^{AMR}$, saturation magnetization of the hard magnetic layer is $Ms^{hard}$, the high saturation magnetization magnetic layer satisfies at least one of $Ms^{high} \geq Ms^{AMR}$ and $Ms^{high} \geq Ms^{hard}$, and an electrode providing a sense current to the magneto-resistance effect film.

A fourth magneto-resistance effect element of the present invention comprises a magneto-resistance effect film having a free layer of which magnetization direction varies depending on an external magnetic field and a pinned layer stacked with the free layer through a non-magnetic layer, wherein the pinned layer has a stacked film of a hard magnetic layer and a non-hard magnetic layer and the non-hard magnetic layer is disposed at least on the side not contacting with the non-magnetic layer, and an electrode providing a sense current to the magneto-resistance effect film. As a hard magnetic layer and a non-hard magnetic layer in this case, a hard magnetic material including Co and an FeCo alloy are particularly effective, respectively.

A magnetic head of the present invention comprises a lower magnetic shield, the above described magneto-resistance effect element of the present invention formed on the lower magnetic shield through a lower read magnetic gap, and an upper magnetic shield formed on the magneto-resistance effect element through an upper read magnetic gap.

A magnetic recording/read separation type head of the present invention comprises a read head having a lower magnetic shield, the above described magneto-resistance effect element of the present invention formed on the lower magnetic shield through a lower read magnetic gap, an upper magnetic shield on the magneto-resistance effect element through an upper read magnetic gap, and a recording head having a lower magnetic pole made in common with the upper magnetic shield, a recording magnetic gap formed on the lower magnetic pole, an upper magnetic pole disposed on the recording magnetic gap.

A magnetic recording apparatus of the present invention comprises a magnetic recording medium and a head slider provided with an above described magnetic recording/read separation type head of the present invention which writes a signal to the magnetic recording medium by a magnetic field and reads a signal by a magnetic field generated from the magnetic recording medium.

When a magneto-resistance effect head is made narrow in its track width to respond to higher recording density, pinning at the edge portion of a free layer becomes important. However, the above described thickening of the film thickness of a hard magnetic biasing film can not effectively increase bias force, instead causes sensitivity decrease.

Now, as a result of the present inventor's investigation on properties or structures of the hard magnetic biasing film, it is clarified to be important, in order to suppress magnetic domain formation at the edge of a free layer, to increase a magnetic flux density than magnetic volume (magnetic volume) of a hard magnetic biasing film. That is, by employing a magnetic biasing film having a higher saturation magnetization compared with a free layer, it is found to be capable of suppressing magnetic domain formation at edge of the free layer.

However, since, when a Co included ferromagnetic material such as a CoFe alloy is used in a free layer, saturation magnetization of the free layer itself is large, a hard magnetic layer only can not suppress the magnetic domain formation at the edge of the free layer. For instance, saturation magnetization of a CoFe alloy is 1500 emu/cc. In a CoCrPt based alloy generally used as a hard magnetic biasing film, though depending on Cr concentration, when Cr is added about 10 at %, its saturation magnetization is at most 500 emu/cc or so. Also in a CoPt system, 800 emu/cc or so is its limit.

As shown in FIG. 1B, since sufficient magnetic flux density can not be obtained by a conventional hard magnetic biasing film B', a bias magnetic field can not be inputted effectively to an edge of a free layer particularly large in its saturation magnetization. Therefore, in a narrow tracked magneto-resistance effect head, suppression of Barkhausen noise is becoming difficult.

Then, in the present invention, as shown in FIG. 1A, a stacked film of a hard magnetic layer H and a high saturation magnetization magnetic layer S is used in a magnetic biasing film B. That is, in the first, the second, the third magneto-resistance effect element of the present invention, a stacked film of a high saturation magnetization magnetic layer and a hard magnetic layer is used as a magnetic biasing film, wherein, the saturation magnetization satisfies at least one condition of saturation magnetization ($Ms^{high} \geq Ms^{free}$ or $Ms^{AMR}$) being more than $Ms^{free}$ (or $Ms^{AMR}$) of a free layer (or a magnetic layer displaying anisotropic magneto-resistance effect) or saturation magnetization ($Ms^{high} \geq Ms^{hard}$ or $Ms^{AMR}$) being more than saturation magnetization $Ms^{hard}$ of the hard magnetic layer.

When a high saturation magnetization magnetic layer satisfies $Ms^{high} \geq Ms^{free}$, as shown in FIG. 1A, for example, like a free layer in which a Co contained ferromagnetic material is employed, also to a free layer F large in its saturation magnetization, a magnetostatic field bias of a high magnetic flux density can be inputted with stability and effectively. Further, although saturation magnetization of a hard magnetic material is difficult to heighten by itself, by stacking a high saturation magnetization magnetic layer satisfying $Ms^{high} \geq Ms^{hard}$ with a hard magnetic layer, saturation magnetization of a magnetic biasing film as a whole can be heightened. In such a case, also to a free layer large in its saturation magnetization, a magnetostatic field bias of a high magnetic flux density can be inputted with stability and effectively. Therewith, occurrence of Barkhausen noise due to magnetic domain formation at the edge of a free layer can be suppressed.

Further, by employing a stacked film of a high saturation magnetization magnetic film and a hard magnetic layer to a magnetic biasing film, a position of a high saturation magnetization magnetic layer can become controllable. Therewith, a magnetostatic field bias of a high magnetic flux density can be inputted effectively to a free layer. Therefore, occurrence of Barkhausen noise of a spin valve film of a reversed structure, a dual element type spin valve film, an anisotropic magneto-resistance effect film stacked with a SAL bias film can be effectively suppressed.

In a fourth magneto-resistance effect element of the present invention, for a pinned layer, a stacked film between a hard magnetic layer and an FeCo alloy layer is applied. By stacking a hard magnetic layer on a non-hard magnetic seed layer such as an FeCo alloy layer, in-plane orientation of c-axis of Co-based alloy can be promoted, resulting in a high squareness ratio (=Mr/Ms). Further, by disposing a non-hard magnetic layer such as an FeCo alloy layer on a non-magnetic layer side, a vertical component of a hard magnetic layer is shielded to result in a large component within its plane. Thereby, influence of a ferromagnetic coupling between an upper ferromagnetic layer and a lower ferromagnetic layer through a non-magnetic layer can be reduced, resulting in an excellent performance.

Further, a magneto-resistance effect element of the present invention can be employed in a magnetic memory device such as an MRAM. A magnetic memory device comprises, for example, an above described magneto-resistance effect element of the present invention, a write electrode for memorizing information to the magneto-resistance effect film, and a read electrode which is consisting of an electrode of the magneto-resistance effect element and reproduces information memorized in the magneto-resistance effect film.

DESCRIPTION OF THE PREFERRED EMBODIMENTS

In the following, embodiments for implementing the present invention will be described with reference to drawings.

Figure 2:
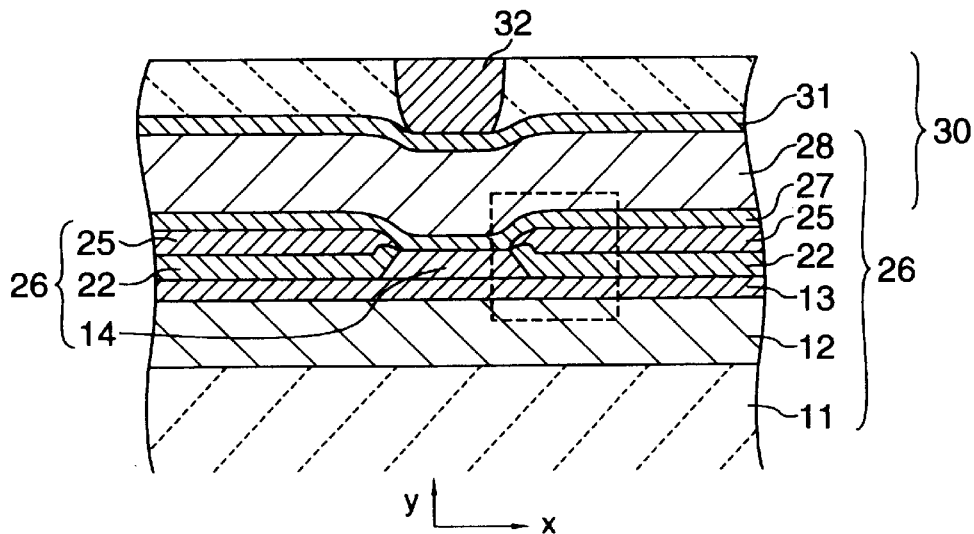
FIG. 2 is a sectional view showing a structure of a first embodiment of a magnetic recording/read separation type head in which the first magneto-resistance effect element of the present invention is applied to a read element portion.
Figure 3:
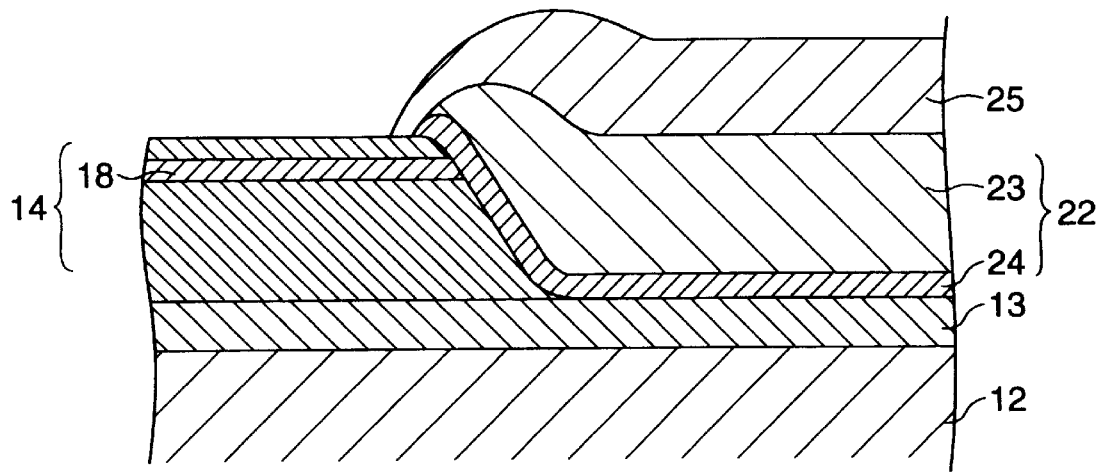
FIG. 3 is a sectional view showing in an exploded manner an essential part of a magneto-resistance effect head in a magnetic recording/read separation type head shown in FIG. 2.
Figure 4:
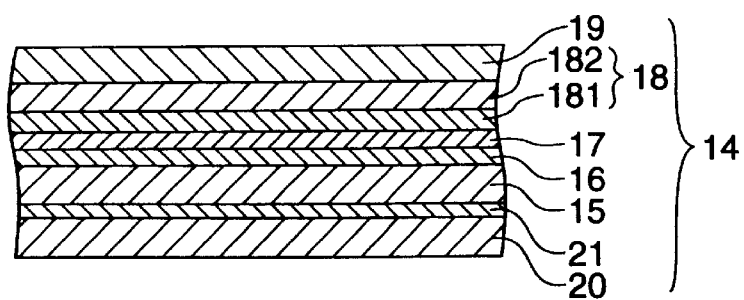
FIG. 4 is a sectional view showing in an exploded manner a magneto-resistance effect film part of a magneto-resistance effect head shown in FIG. 2.

A first embodiment of a magnetic recording/read separation type head in which a magneto-resistance effect element of the present invention is applied in a read element portion will be described. FIG. 2, FIG. 3 and FIG. 4 are diagrams showing structures of embodiments of magnetic recording/read separation type heads in which a first magneto-resistance effect element of the present invention is applied in read element portions. FIG. 2 is a sectional view of a magnetic recording/read separation type head seen from an air bearing surface direction. In FIG. 2, x-direction is a track width direction, y-direction is a recording track running direction corresponding to a film thickness direction. FIG. 3 is a sectional view showing in an exploding manner an essential portion of FIG. 2 (portion surrounded by a dotted line in FIG. 2), FIG. 4 is an exploded diagram of a magneto-resistance effect film portion.

In these figures, numeral 11 is a substrate. For a substrate 11, an $Al_2O_3$/TiC substrate having an $Al_2O_3$ layer can be used. On one main surface of such a substrate 11, a lower magnetic shield layer 12 consisting of a soft magnetic material such as a NiFe alloy, an FeSiAl alloy, an amorphous CoZrNb alloy and the like is formed. On a lower magnetic shield layer 12, a magneto-resistance effect film (MR film) 14 is formed through a lower read magnetic gap 13 consisting of a non-magnetic insulation material such as $AlO_x$.

An MR film 14, as shown in FIG. 4, has a magnetic multi-layered film formed by stacking sequentially at least an antiferromagnetic layer 15, a pinned layer 16, a non-magnetic layer 17, and a free layer 18 of which magnetization direction varies according to an external magnetic field, and is a spin valve film showing a giant magneto-resistance effect (spin valve GMR film). A pinned layer 16 is disposed at a lower side (substrate 11 side), a free layer 18 is disposed at the upper side. Thus, an MR film 14 is a spin valve GMR film 14 of a reversed structure. A free layer 18 has a ferromagnetic layer 181 containing Co such as a CoFe alloy layer or a CoFeB alloy layer, the Co containing ferromagnetic layer 181 being disposed abutting on a non-magnetic layer 17.

On a Co containing ferromagnetic layer 181, to enhance a soft magnetic performance as a free layer 18, a soft magnetic assist layer is stacked. As a soft magnetic assist layer, an amorphous soft magnetic material such as a CoZrNb alloy or a crystalline soft magnetic material such as a NiFe alloy can be employed. In this embodiment, on a Co containing ferromagnetic layer 181, a NiFe alloy layer 182 is disposed as a soft magnetic assist layer.

A pinned layer 16 is formed on an antiferromagnetic layer 15 consisting of an IrMn alloy or other Mn based such as NiMn, PtMn, PtRhMn alloy. A pinned layer 16 is provided with a transverse direction bias through exchange-coupling with an antiferromagnetic layer 15 to be pinned. The pinned layer 16 is consisting of a Co containing ferromagnetic material such as a CoFe alloy identical as a free layer 18, for example. Inbetween a pinned layer 16 and an antiferromagnetic layer 15, a NiFe alloy layer and the like can be inserted. Here, if a diffusion barrier layer containing oxygen or nitrogen is disposed between the NiFe alloy layer and the pinned layer 16, high change rate of resistance and excellent heat resistance can be materialized.

On the pinned layer 16, through a non-magnetic layer 17 consisting of such as Cu, Au, Ag and alloys therebetween, a free layer 18 is disposed. In addition, in the figure, respective numerals 19, 20, and 21 are a protective film consisting of such as Ta or Ti, a non-magnetic under layer consisting of such as Ta or Ti, and an under layer having a fcc structure such as Cu, a NiFe magnetic alloy, respectively. They are formed as occasion arises.

As a specific constitution of a spin valve GMR film 14 of a reversed structure, a constitution stacked sequentially from the substrate side Ta (5 nm) 20/IrMn (10 nm) 15/CoFe (2 nm) 16/Cu (3 nm) 17/CoFe (3 nm) 181/NiFe (5 nm) 182/Ta (5 nm) 19, can be cited.

A spin valve GMR film 14 in which a Co containing ferromagnetic material such as a CoFe alloy is employed in a pinned layer 16 and a part of a free layer (181), in addition to displaying a large MR change rate, has heat resistance and long term stability during a head formation process. As a Co containing ferromagnetic material, Co or a Co alloy in which Fe, Ni, the other element are added (Co based magnetic alloy) to Co can be cited, a Co alloy is particularly preferable.

As an element to be added to the Co alloy, other than the above described Fe or Ni, one or more than 2 kinds of element among Pd, Au, Ag, Cu, Pt, Ir, Rh, Ru, Os, Hf, B, Al, Si can be used. An amount of these additional elements is preferable to be in the range of from 5 to 50 at %. As a Co alloy, use of a CoFe alloy containing Fe particularly in the range of from 5 to 40 at % is desirable from the view point of an MR change rate or an exchange-coupling force with an antiferromagnetic layer 15.

In addition, for a pinned layer 16 and a free layer 18, a NiFe alloy such as $Ni_{80}Fe_{20}$(at %) can be employed, for example.

A spin valve GMR film 14 of a reversed structure, to make a length of an x-direction becomes a desired track width, has a shape in which the outsides of both edge portions off a recording track width are removed by etching. Outside the edge portions of such a spin valve GMR film 14, a hard magnetic biasing films 22 for longitudinal biasing respectively to a spin valve GMR film 14 are disposed. A pair of hard magnetic biasing films 22 form abutted junction with the edge portions of a spin valve GMR film 14.

A hard magnetic biasing film 22, as shown in FIG. 3, has a laminate film stacked a Co based hard magnetic layer 23 and a high saturation magnetization magnetic layer (high Ms magnetic layer) 24. A Co based hard magnetic layer 23 is consisting of a Co containing hard magnetic material such as a CoPt alloy or a CoCrPt alloy. As a specific constitution of a stacked film, as shown in FIG. 3, a structure stacked a Co based hard magnetic layer 23 on a high Ms magnetic layer 24 can be cited. In such a structure, a high Ms magnetic layer 24 functions as a magnetic under layer of a Co based hard magnetic layer 23. The Co based hard magnetic layer 23 abuts on the edge portion of a spin valve GMR film 14 through the high Ms magnetic layer 24 as a magnetic under layer.

Further, the spin valve GMR film 14 shown in FIG. 3 shows a film structure while omitting other than that of the free layer 18.

A high Ms magnetic layer 24, when saturation magnetization thereof is $Ms^{high}$, saturation magnetization of the free layer 18 is $Ms^{free}$, saturation magnetization of a Co based hard magnetic layer 23 is $Ms^{hard}$, satisfies at least one of $Ms^{high} \geq Ms^{free}$ or $Ms^{high} \geq Ms^{hard}$. It is more preferable to satisfy both conditions at the same time. In addition, the saturation magnetization $Ms^{free}$ of the free layer 18, when the free layer 18 has a stacked structure, designates an average value thereof.

In this embodiment, though a free layer 18 is disposed on the upper layer side of a spin valve GMR film 14, the edge portion of the free layer 18 contacts a high Ms magnetic layer 24. To a free layer 18, an exchange bias accompanying exchange-coupling with the high Ms magnetic layer 24 is inputted, further a magnetostatic field bias mainly based on the high Ms magnetic layer 24 is inputted. Therewith, a bias magnetic field is inputted to the free layer 18.

On a pair of hard magnetic biasing films 22, a pair of electrodes 25 consisting of Cu, Au, Zr, Ta and the like is formed. On the spin valve GMR film 14, a sense current is supplied from a pair of electrodes 25. These of a spin valve GMR film 14, a pair of hard magnetic biasing films 22 and a pair of electrodes 25 constitute a GMR read element portion 26. The GMR read element portion 26 has the above described abutted junction structure.

On the GMR read element portion 26, an upper read magnetic gap 27 consisting of a non-magnetic insulation material identical with a lower read magnetic gap 13 is formed. Further, on the upper read magnetic gap 27, an upper magnetic shield layer 28 consisting of a soft magnetic material identical with that of a lower magnetic shield layer 12 is formed. With these constituent elements, a shield type GMR head 29 as a read head is constituted.

As a recording head, a thin film magnetic head 30 is formed on a shield type GMR head 29. A lower side recording magnetic pole of a thin film magnetic head 30 is made up of a magnetic layer used in common with the upper magnetic shield layer 28. The upper magnetic shield layer 28 of the shield type MR head 29 is used in common with the lower magnetic pole of the thin film magnetic head 30. On the lower side recording magnetic pole 28 used in common with the upper magnetic shield layer, a recording magnetic gap 31 consisting of a non-magnetic insulation material such as $AlO_x$ and an upper side recording magnetic pole 32 are sequentially formed. Behind side from an air bearing surface, a recording coil (not shown in the figure)for supplying a recording magnetic field to the lower side recording magnetic pole 28 and the upper side recording magnetic pole 32 is formed.

In the above described shield type GMR head 29, when a high Ms magnetic layer 24 has saturation magnetization $Ms^{high}$ ($\geq Ms^{free}$) equal or more than saturation magnetization $Ms^{free}$ of the free layer 18, in addition to an exchange bias accompanying exchange-coupling between the free layer 18 and the Ms magnetic layer 24, a magnetostatic field bias of high magnetic flux density is inputted to the edge portion of the free layer 18. Therewith, even in the case where the free layer 18 contains a Co containing ferromagnetic layer 181 large in its saturation magnetization, the bias magnetic field can be inputted effectively and with stability. Therefore, occurrence of Barkhausen noise accompanying magnetic domain formation at the edge portion of the free layer 18 can be effectively suppressed.

Further, although a hard magnetic material does not become large in its saturation magnetization by it only, by forming a hard magnetic layer 23 on a high Ms magnetic layer 24, saturation magnetization $Ms^{total}$ of a hard magnetic biasing films 22 as a whole can be improved. By enhancing the saturation magnetization $Ms^{total}$ of the hard magnetic biasing film 22 as a whole, a magnetostatic field bias of high flux density can be inputted to the edge portion of the free layer 18. Therefore, occurrence of Barkhausen noise due to the magnetic domain formation at the edge portion of the free layer 18 can be effectively suppressed.

To realize such a state, a high Ms magnetic layer 24 satisfying saturation magnetization $Ms^{high}$ ($\geq Ms^{hard}$) equal or more than saturation magnetization $Ms^{hard}$ of the hard magnetic layer 23 can be used. In other words, by using a high Ms magnetic layer 24 satisfying $Ms^{high} \geq Ms^{hard}$, occurrence of Barkhausen noise due to the magnetic domain formation at the edge portion of the free layer 18 can be effectively suppressed.

Further, the high Ms magnetic layer 24 functions as a magnetic under layer of a Co based hard magnetic layer 23. Thus, when a magnetic under layer is applied as an under layer of the Co based hard magnetic layer, the free layer and the magnetic under layer, and the magnetic under layer and the Co based hard magnetic layer are respectively exchange-coupled. This means that, when the free layer rotates magnetically due to a medium magnetic field, magnetization direction of the Co based hard magnetic layer is also influenced remarkably through exchange-coupling.

Figure 5A:
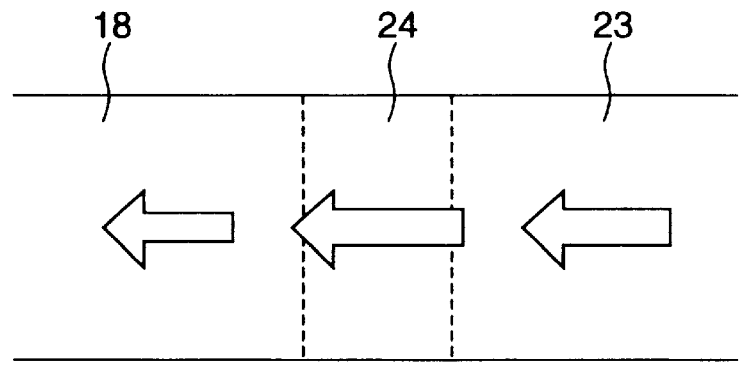
FIG. 5A, FIG. 5B and FIG. 5C are diagrams schematically showing magnetization states accompanying magnetization rotation of free layers when both a magnetic under layer and a hard magnetic layer are high saturation magnetization.
Figure 5B:
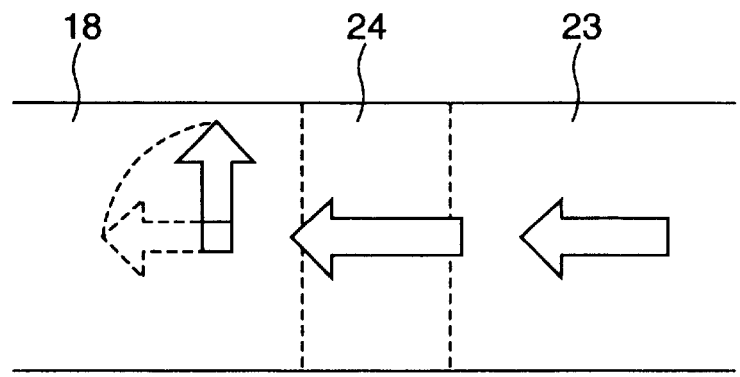
Figure 5C:
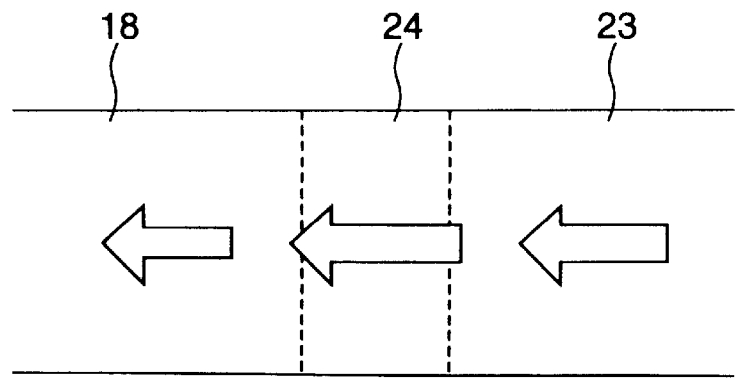
Figure 6A:
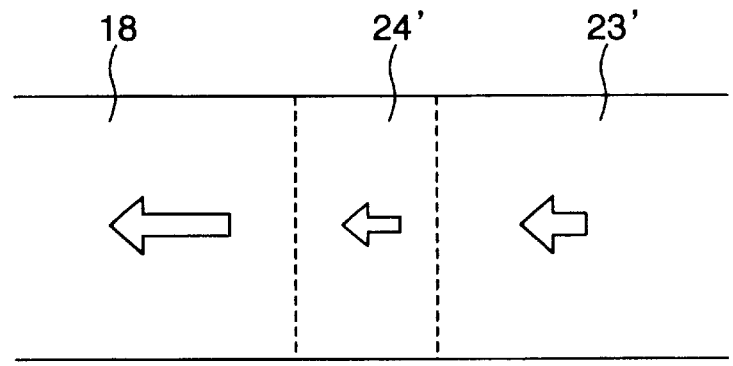
FIG. 6A, FIG. 6B and FIG. 6C are diagrams schematically showing magnetization states accompanying magnetization rotation of free layers when both a magnetic under layer and a hard magnetic layer are low saturation magnetization.
Figure 6B:
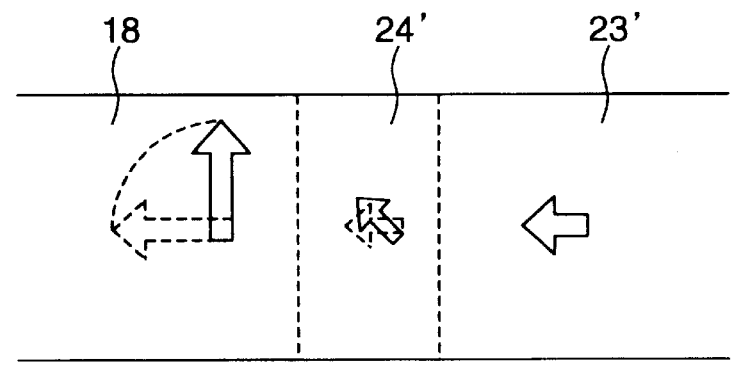
Figure 6C:
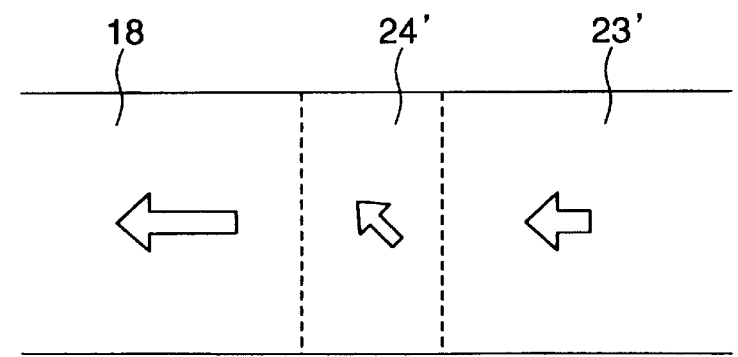

Here, a case where both a magnetic under layer and a Co based hard magnetic layer are in low Ms, and a case where both a magnetic under layer and a Co based hard magnetic layer are in high Ms will be discussed. FIG. 5A, FIG. 5B and FIG. 5C are diagrams schematically showing magnetization states where both the magnetic under layer and the Co based hard magnetic layer are in high Ms. On the contrary, FIG. 6A, FIG. 6B and FIG. 6C are diagrams schematically showing magnetization states where both the magnetic under layer and the Co based hard magnetic layer are in low Ms. All of them show states of the film surface direction (track width direction (x)).

As shown in FIG. 6A and FIG. 6B, in the magnetic under layer 24' of low Ms, when the free layer 18 rotates its magnetization, the magnetic under layer 24' becomes a state easily rotating magnetically due to exchange-coupling. Therefore, as shown in FIG. 6C, hysteresis is brought about to cause noise. Such a state is particularly remarkable when a hard magnetic layer 23' is in a low Ms state.

Besides, in this embodiment, since a high Ms magnetic layer 24 is employed as a magnetic under layer of the Co based hard magnetic layer 23, noise occurrence due to magnetization rotation of the above described magnetic under layer can be suppressed. That is, as shown in FIG. 5A and FIG. 5B, when a high Ms magnetic layer 24 is used as an magnetic under layer, if the free layer 18 rotates its magnetization, magnetization direction of the high Ms magnetic layer (magnetic under layer) 24 is stable. Therefore, as shown in FIG. 5C, hysteresis does not occur. Instability of the magnetization direction of the magnetic under layer due to exchange-coupling between the magnetic under layer and the free layer 18 can be removed.

When realizing such a state, for a high Ms magnetic layer 24 as a magnetic under layer, a magnetic material satisfying saturation magnetization $Ms^{high}$ ($\geq Ms^{free}$) equal or more than saturation magnetization $Ms^{free}$ of the free layer 18 can be used. In other words, by using a high Ms magnetic layer 24 satisfying $Ms^{high} \geq Ms^{free}$ as a magnetic under layer, noise occurrence due to magnetization instability of the magnetic under layer can be suppressed.

By using a high Ms magnetic layer 24 having saturation magnetization $Ms^{high}$ satisfying $Ms^{high} \geq Ms^{hard}$ as a magnetic under layer, thereby enhancing saturation magnetization of a hard magnetic biasing film 22 as a whole, magnetization instability of the hard magnetic biasing film 22 accompanying magnetization rotation of the free layer 18 can be removed. Therefore, noise occurrence can be suppressed.

Now, the high Ms magnetic layer 24 itself as a magnetic under layer, since it does not have a hard magnetic property, it is necessary to fully suppress magnetization due to exchange-coupling with the hard magnetic layer 23. To suppress magnetization of the high Ms magnetic layer 24, a certain degree of magnetic volume ratio (=(Ms×t of hard magnetic layer)/(Ms×t of high Ms magnetic layer)) is necessary between the high Ms magnetic layer 24 and the hard magnetic layer 23. Therefore, the hard magnetic layer 23 itself is desired to be high in its Ms. In specific, since the magnetic volume ratio also depends on a thickness, when the thickness of the high Ms magnetic layer 24 is $t^{high}$, that of the hard magnetic layer 23 is $t^{hard}$, it is preferable to satisfy $Ms^{high} \times t^{high} \leq Ms^{hard} \times t^{hard}$. When the thickness of the high Ms magnetic layer 24 as a magnetic under layer is too thick, since there is a concern that suppression by the hard magnetic layer 23 tends to be insufficient, the thickness $t^{high}$ of the high Ms magnetic layer 24 is preferable to be 20 nm or less.

In this embodiment, based on the high Ms magnetic layer 24 as described above, a magnetostatic bias of a high magnetic flux density can be inputted at the edge portion of the free layer 18. Further, also instability of the magnetization direction of the magnetic under layer can be cancelled by application of the high Ms magnetic layer 24. Therefore, since the bias magnetic field is inputted with stability and effectively at the edge portion of the free layer 18, occurrence of Barkhausen noise due to magnetic domain formation at the edge portion of the free layer 18 can be effectively suppressed. The high Ms magnetic layer 24, though it may have saturation magnetization $Ms^{high}$ satisfying at least one condition of $Ms^{high} \geq Ms^{free}$ or $Ms^{high} \geq Ms^{hard}$, in order to obtain suppression effect of Barkhausen noise with stability, it is preferable to be $Ms^{high} \geq Ms^{free}$ and $Ms^{high} \geq Ms^{hard}$.

Now, though, in the above described embodiment, a spin valve film of a reversed structure is employed in an MR film 14, even in the case where an anisotropic magneto-resistance effect film (AMR film) is employed, identical effect can be obtained.

Figure 7:
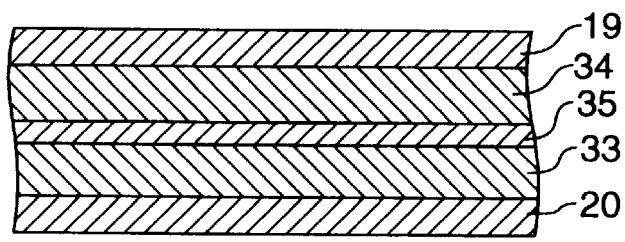
FIG. 7 is a sectional view showing in an exploded manner a part of a magneto-resistance effect film of a head structure in which a third magneto-resistance effect element of the present invention is applied in a magneto-resistance effect head shown in FIG. 1A and FIG. 1B.

FIG. 7 is a sectional view showing a film structure when an AMR film is employed. An AMR film 34 as a free layer is stacked with a SAL bias film 33 through a non-magnetic layer 35. For an AMR film 34, such as a NiFe alloy film of a thickness of about 10 nm, for example, can be used. On the SAL bias film 33 of a thickness of about 2 to 30 nm consisting of a Co based amorphous alloy or a NiFeX alloy film (X is Rh, Nb, Ta and the like), through a non-magnetic layer 35 consisting of a Ta film or a Ta nitride film of a thickness of about 5 nm, an AMR film 34 is formed. For such a film structure, a hard magnetic biasing film 22 consisting of a stacked film of a hard magnetic layer 23 and a high Ms magnetic layer 24 is effective.

Here, when a NiFe alloy is used as a free layer, since its saturation magnetization is such small as about 800 emu/cc, in a hard magnetic biasing film consisting of a hard magnetic layer only, its saturation magnetization does not cause such a problem. However, when a Co containing ferromagnetic material (Ms value of, for example, a CoFe alloy is 1500 emu/cc)of such a high Ms as, for example, 800 emu/cc or more is employed in the free layer 18, noise occurrence becomes remarkable because saturation magnetization of the hard magnetic biasing film 22 is small compared with that of the free layer 18. The present invention is particularly to circumvent a problem when a free layer 18 of such a high Ms is used. However, even when a free layer is mainly provided with a NiFe alloy layer, since a bias magnetic field can be effectively inputted by employing a high Ms magnetic layer 24, noise occurrence can be suppressed still further.

Further, when the track width becomes narrow as described above, pinning at the edge portion of the free layer 18 becomes so important that the conventional bias structure could not fully suppress occurrence of Barkhausen noise. For such a problem, according to the bias structure of the present invention, the bias magnetic field can be effectively inputted at the edge portion of the free layer 18. The present invention can suppress increase of Barkhausen noise due to track width narrowing. The present invention is particularly effective when the length of the track width direction (x direction) of such as a spin valve GMR film 14 is 3 μm or less.

Figure 8:
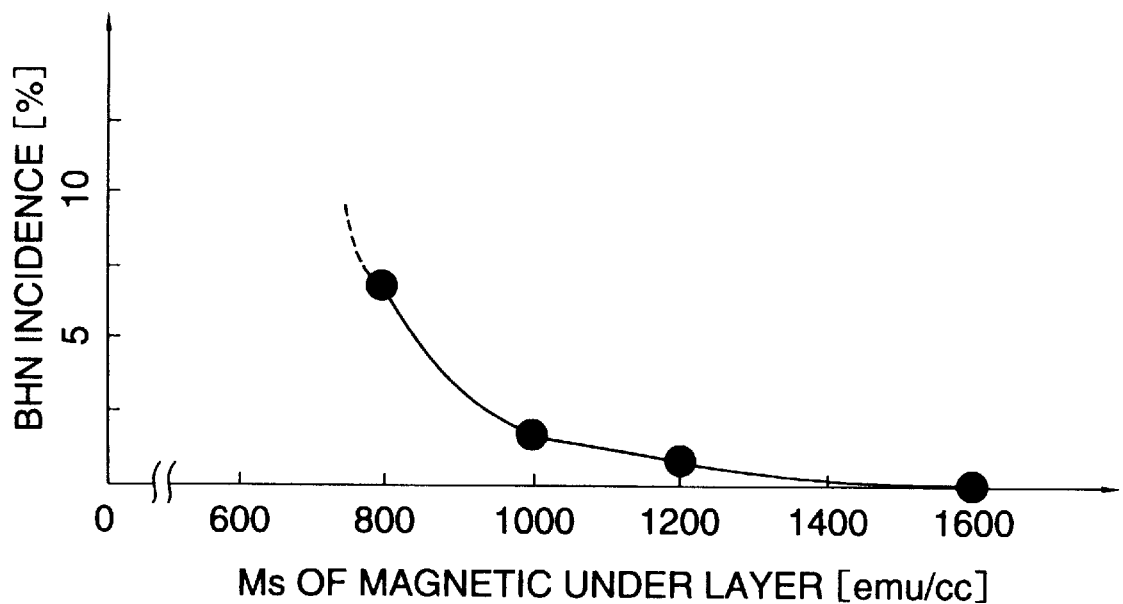
FIG. 8 is a diagram showing a relationship between saturation magnetization $Ms^{high}$ of a high Ms magnetic layer and an incidence of Barkhausen noise.

A specific saturation magnetization $Ms^{high}$ of a high Ms magnetic layer 24, to enable to operate the longitudinal bias field effectively to various kinds of free layers 18, is preferable to be 1000 emu/cc or more. To suppress also variation of the magnetization direction of the hard magnetic biasing film 22 accompanying rotation of the magnetization of the free layer 18, the saturation magnetization $Ms^{high}$ of the high Ms magnetic layer 24 is preferable to be 1000 emu/cc or more. FIG. 8 shows a relationship between saturation magnetization $Ms^{high}$ of the high Ms magnetic layer 24 and incidence of Barkhausen noise. When the $Ms^{high}$ is 1000 emu/cc or more, incidence of Barkhausen noise becomes particularly low.

Here, the incidence of Barkhausen noise shown in FIG. 8 is obtained by using an only lower-side shielded (without upper magnetic shield) micro-element (the size is same with the true head, the size of the height direction is determined by patterning with PEP instead of polishing) in place of a true head. Whether Barkhausen noise occurred or not is determined by measuring magnetostatic characteristics (ρ-H curve) of the micro-element. If there is no jump in the ρ-H curve, it is designated as no occurrence of Barkhausen noise, and if there is a jump, it is designated as occurrence of Barkhausen noise. The incidence of Barkhausen noise is obtained by measuring a certain number of micro-elements of the same parameter, and by dividing the number of pieces in which Barkhausen noise occurred by the number of the measured pieces and multiplying the obtained number by 100. The incidence of Barkhausen noise shown below is obtained in the identical manner.

Further, to suppress variation of the magnetization direction of the hard magnetic biasing film 22 accompanying the magnetization rotation of the free layer 18, it is preferable that a total remanent magnetization $Mr^{total}$ of a stacked film of the high Ms magnetic layer 24 and the hard magnetic layer 23 is to be 600 emu/cc or more. According to a hard magnetic biasing film 22 of such a high remanent magnetization (high Mr) and a low dispersion (high squareness ratio (=Mr/Ms) S), variation of the magnetization direction of the hard magnetic biasing film 22 accompanying the magnetization rotation of the free layer 18 can be suppressed effectively. Therefore, the bias magnetic field can be inputted with stability and effectively to the free layer 18. When the $Mr^{total}$ is 600 emu/cc or more, in particular, the incidence of Barkhausen noise becomes low.

As a specific constituent material of the high Ms magnetic layer 24, various kinds of magnetic materials can be used if they satisfy at least one condition of the above described $Ms^{high} \geq Ms^{free}$ or $Ms^{high} \geq Ms^{hard}$. For example, such as an FeCo alloy, an FeZr alloy, an FeZrN alloy, an amorphous CoZrNb alloy can be cited. For the high Ms magnetic layer 24, in particular, it is preferable to use an FeCo alloy which is large in its saturation magnetization and promotes hard magnetic property in its plane of a hard magnetic layer 23 such as CoPt further stacked thereon.

Figure 1A:
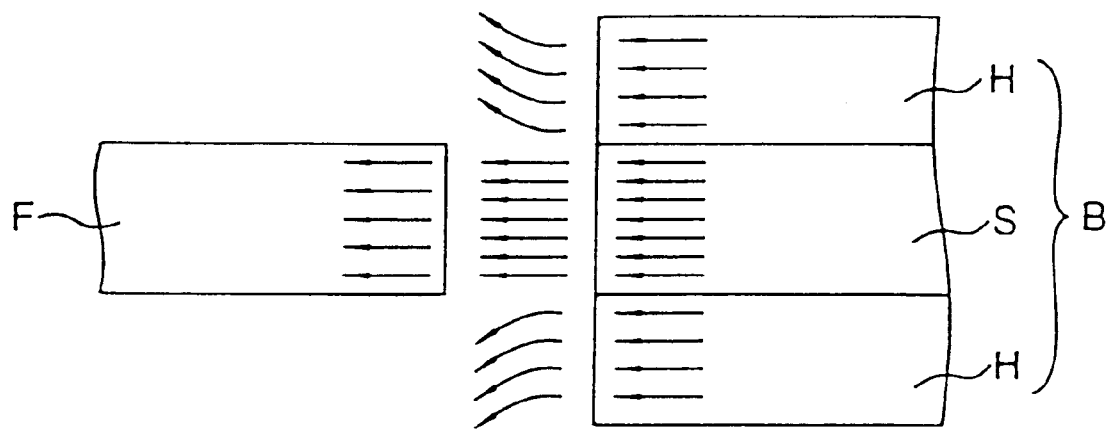
FIG. 1A is a conceptual diagram showing an input state of a bias magnetic field in a magneto-resistance effect element of the present invention.
Figure 1B:
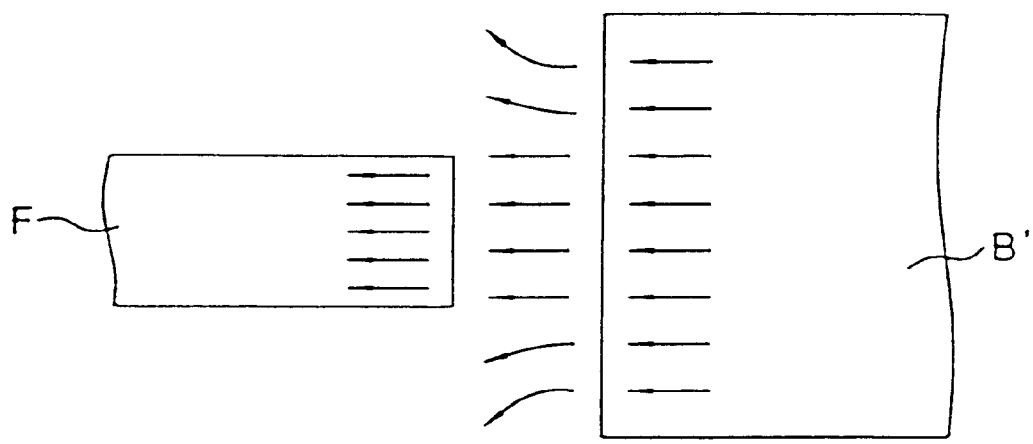
FIG. 1B is a conceptual diagram showing an input state of a bias magnetic field in a conventional magneto-resistance effect element.
Figure 9:
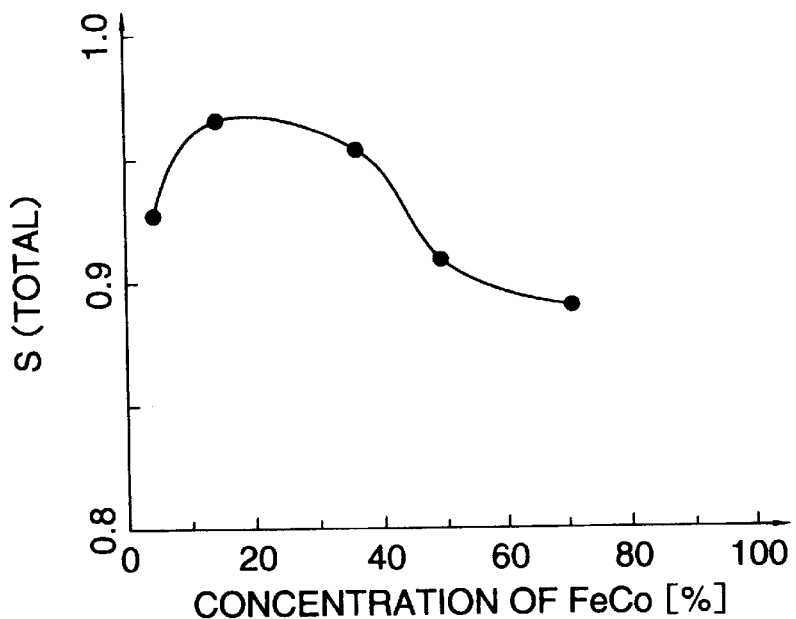
FIG. 9 is a diagram showing Co concentration in an FeCo alloy dependency of a squareness ratio (=Mr/Ms) $S^{total}$ of a stacked film of an FeCo alloy film and a CoPt film.
Figure 10:
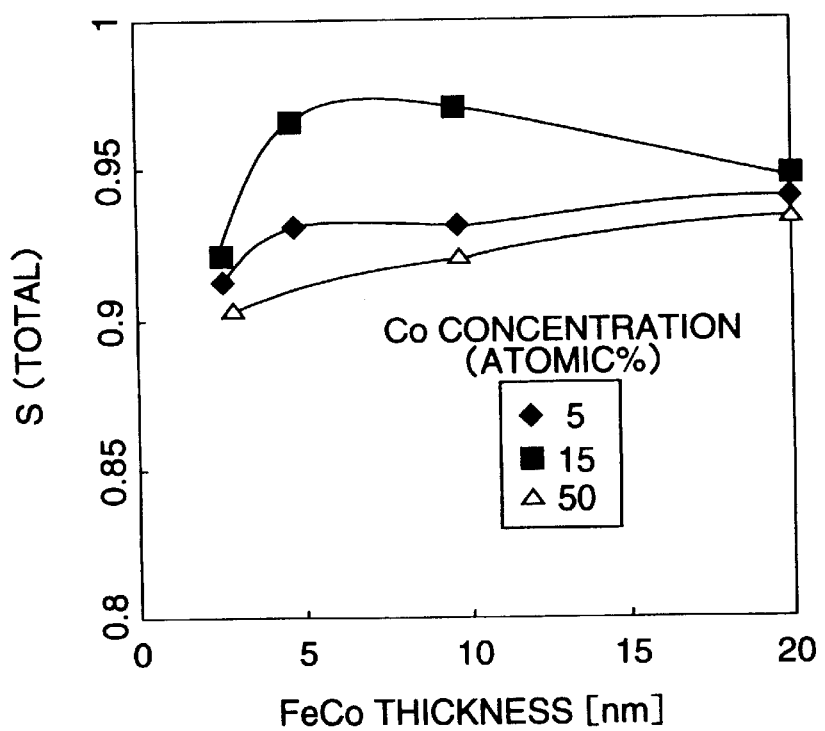
FIG. 10 is a diagram showing a relationship between film thicknesses of FeCo alloy films and squareness ratio (=Mr/Ms)s $S^{total}$ of stacked films between an FeCo alloy film and a CoPt film.
Figure 11:
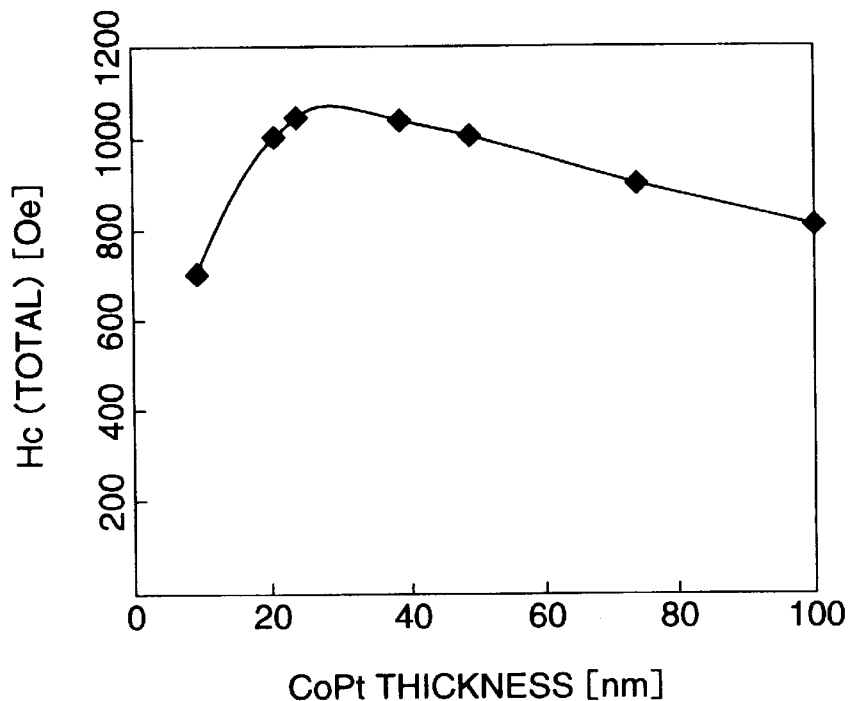
FIG. 11 is a diagram showing a relationship of film thicknesses of CoPt alloy films and coercive forces $Hc^{total}$ of stacked films between an FeCo alloy film and a CoPt film.

In Table 1, a relationship between compositions of FeCo alloys to be used as a high Ms magnetic layer and magnetic characteristics. The magnetic characteristics shown in FIG. 1A and FIG. 1B are coercive force Hc and saturation magnetization Ms obtained for FeCo alloy films of a film thickness of 5 nm. Further, in FIG. 9 and FIG. 10, Co concentration dependency of the squareness ratio (=Mr/Ms) S of the FeCo alloy are shown. Here, FIG. 9 shows squareness ratio (=Mr/Ms) $S^{total}$ for the case where a CoPt film of 22 nm thickness is formed on an FeCo alloy film of 5 nm thickness. FIG. 10 shows a relationship between film thicknesses of the FeCo alloy film and squareness ratio (=Mr/Ms)s $S^{total}$ while Co concentration is varied.

TABLE 1

| FeCo alloy composition (at %) | $Fe_{85}Co_{15}$ | $Fe_{95}Co_5$ | $Fe_{50}Co_{50}$ |
|---|---|---|---|
| Coercive force (Oe) | 19 | 20 | 30 |
| Saturation magnetization Ms (emu/cc) | 1600 | 1425 | 1675 |

From Table 1, FIG. 9 and FIG. 10, it is obvious that Co concentration of the FeCo alloy is preferable to be 40 at % or less to obtain a high Ms and a high S. Further, since corrosion resistance deteriorates when the Co concentration is too low, it is preferable for the Co concentration to be 5 at % or more. Thus, an FeCo alloy containing Co in the range of 5 to 40 at % is particularly preferable for a constituent material of the high Ms magnetic layer 24.

For a hard magnetic layer 23, various kinds of Co based hard magnetic alloys such as a CoPt alloy or a CoCrPt alloy can be used. Though these Co based hard magnetic alloys are excellent in their hard magnetism or corrosion resistance, from the view point of materializing a high Hc or a high Mr by exchange-coupling with the high Ms magnetic layer 24, use of a hard magnetic material of high Ms is desired. From these reasons, a CoPt alloy is more preferable to a CoCrPt alloy as a constituent material of the hard magnetic layer 23.

Film thicknesses of the high Ms magnetic layer 24 and the hard magnetic layer 23 are desirable to be decided on considering to avoid lowering $Hc^{total}$ of laminated films. For example, if the film thickness of the high Ms magnetic layer 24 is made too thick, the coercive force $Hc^{total}$ of the hard magnetic biasing film 22 as a whole decreases. Therefore, the film thickness of the high Ms magnetic layer 24 is preferable to be set in the range of 3 to 20 nm. If the hard magnetic layer 23 is made too thick, the magnetostatic field bias becomes too strong to deteriorate sensitivity. In addition, since in-plane orientation of c-axis of the hard magnetic layer 23 also decreases according to increase of the film thickness of the hard magnetic layer 23, the coercive force Hc and squareness ratio (=Mr/Ms) S are caused to decrease. From these, the film thickness of the hard magnetic layer 23 is preferable to be 100 nm or less, and more preferable to be 50 nm or less.

As to thickness ratio of the high Ms magnetic layer 24 and the hard magnetic layer 23, when an FeCo alloy film is used for the high Ms magnetic layer 24 and a CoPt alloy film is used for the hard magnetic layer 23, if the respective film thicknesses of the FeCo alloy films are about 5 nm, 10 nm and 20 nm, the film thicknesses of the CoPt alloy films are preferable to be in the range of from 15 to 100 nm (more preferable to be in the range of 20 to 50 nm), in the range of from 20 to 100 nm (more preferable to be in the range of 30 to 60 nm), and in the range of from 25 to 100 nm, respectively.

As described above, as a specific constitution of a hard magnetic biasing film 22 suitable for the present invention, a stacked film of a Co based hard magnetic layer 23 consisting of a CoPt alloy and a high Ms magnetic layer 24 consisting of an FeCo alloy can be cited. In particular, a stacked film of a hard magnetic layer 23 consisting of $Co_{80}Pt_{20}$ and a high Ms magnetic layer 24 consisting of $Fe_{85}Co_{15}$ is preferable.

Magnetic characteristics of a specific stacked film will be described. On an $AlO_x$ gap, a stacked film of $Fe_{85}Co_{15}$ (5 nm)/$Co_{80}Pt_{20}$ (40 nm) is formed in film in the same vacuum with a magnetron sputtering method. The magnetic characteristics of the stacked film displayed a M-H curve integrated through exchange-coupling of 2 layers. This time, the in-plane coercive force $Hc^{total}$ was 1050Oe, the remanent magnetization $Mr^{total}$ was 980 emu/cc and the squareness ratio (=Mr/Ms) S was 0.94.

By combining a high Ms magnetic layer 24 consisting of an FeCo alloy and a hard magnetic layer 23 consisting of a CoPt alloy, while a CoPt hard magnetic layer 23 satisfying a coercive force practically non-problematic even on the FeCo high Ms magnetic layer 24 as a magnetic under layer, a high Mr and a low dispersion (high S) not materialized with a single CoPt hard magnetic layer can be realized.

Here, the film thickness of a CoPt alloy film is varied with the film thickness of an FeCo alloy film fixed at 5 nm to obtain the magnetic characteristics shown in FIG. 11 through FIG. 14. From FIG. 11, it is obvious that, although the Hc decreases a little bit at 40 nm or more when the film thickness of the CoPt alloy is made thick, decrease of the $Hc^{total}$ is suppressed in the range not practically problematic due to the effect of an FeCo alloy film as an under layer. On the contrary, if the film thickness of the CoPt alloy film becomes thin, the coercive force decreases with relation to a magnetic volume ratio when exchange-coupled with the FeCo alloy film, but there is no problem when the coercive force is in the range shown in FIG. 11.

Figure 12:
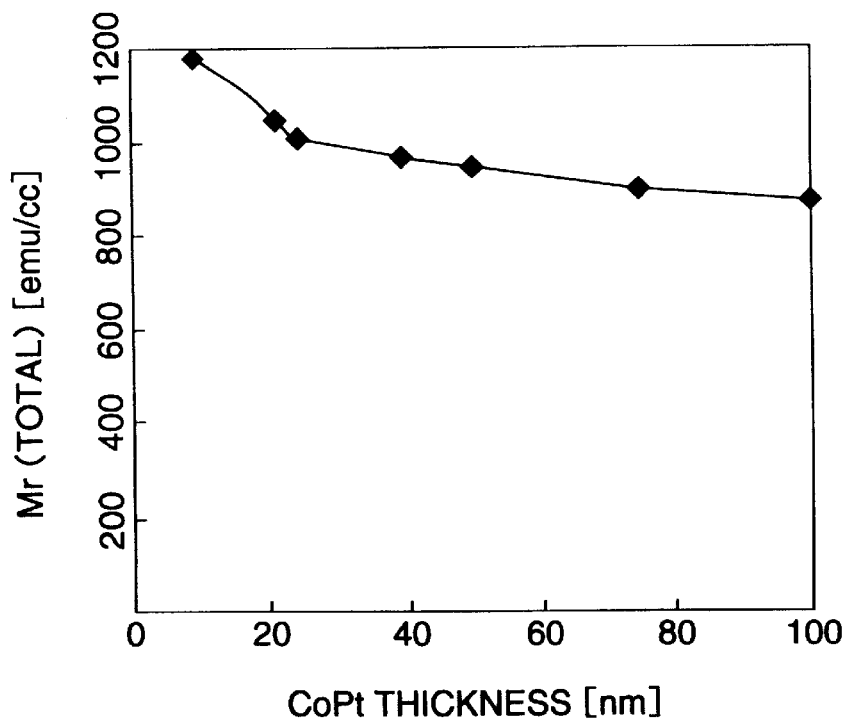
FIG. 12 is a diagram showing a relationship of film thicknesses of CoPt alloy films and remanent magnetizations $Mr^{total}$ of stacked films between an FeCo alloy film and a CoPt film.
Figure 13:
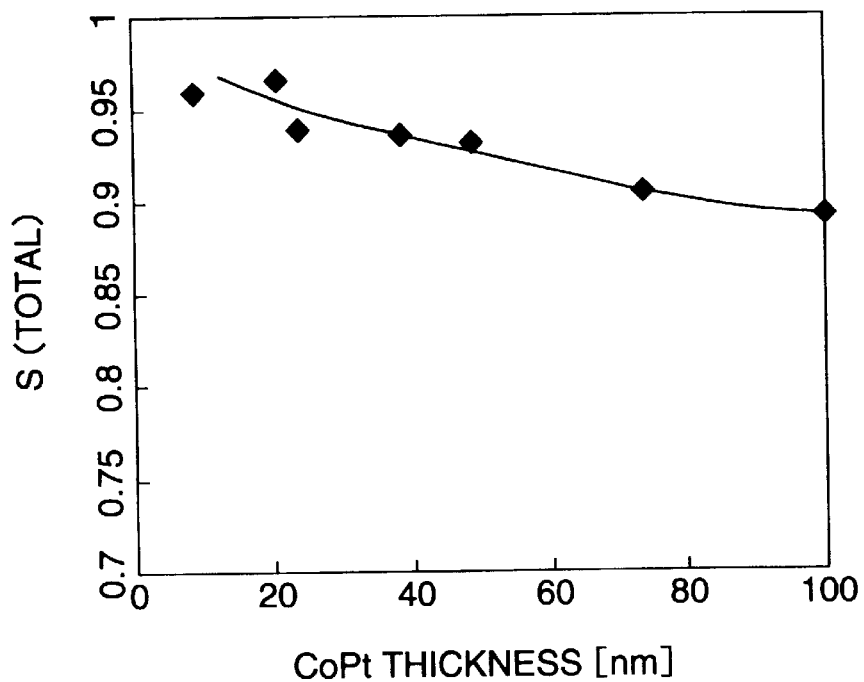
FIG. 13 is a diagram showing a relationship of film thicknesses of CoPt alloy films and squareness ratio (=Mr/Ms)s $S^{total}$ of stacked films between an FeCo alloy film and a CoPt film.
Figure 14:
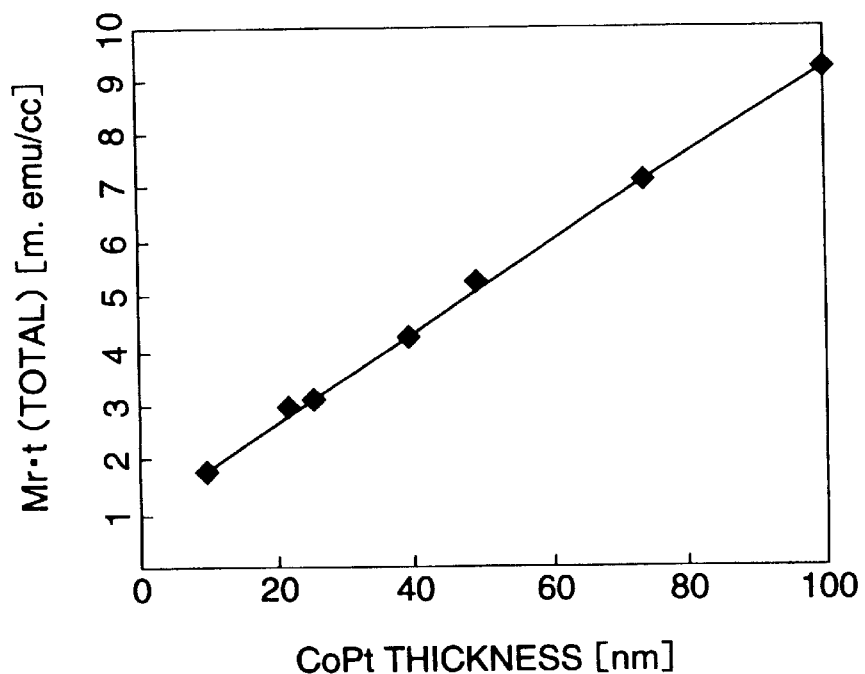
FIG. 14 is a diagram showing a relationship between film thicknesses of CoPt alloy films and $Mr \times t^{(total)}$.

From FIG. 12, it is found that, due to the effect of an FeCo alloy film of high Ms, a total $Mr^{total}$ of a stacked film made of 2 layers realized a high Mr of 800 emu/cc or more at all thicknesses. A hard magnetic biasing film of the high Mr not capable of realizing with a hard magnetic film alone can be obtained by stacking with an FeCo alloy film of high Ms. From FIG. 13, it is seen that a film of which the squareness ratio (=Mr/Ms) $S^{total}$ is also very high in the region where the film thickness of the CoPt alloy film is thin and the dispersion is small can be obtained. While, if the film thickness of the CoPt alloy film is increased up to 80 nm, it displays still high value of 0.9, it is obvious that, due to the effect of the FeCo alloy film, the orientation vertical to c-axis due to film thickness increase of the CoPt alloy film is suppressed. This also can be read from FIG. 14, that is, the film thicknesses of the CoPt alloy films and magnetic volumes ($Mr \times t^{(total)}$) are in a very good linearity, deviation from the linearity of $Mr \times t^{(total)}$ due to the film thickness increase of the CoPt alloy film can not be found.

Figure 15:
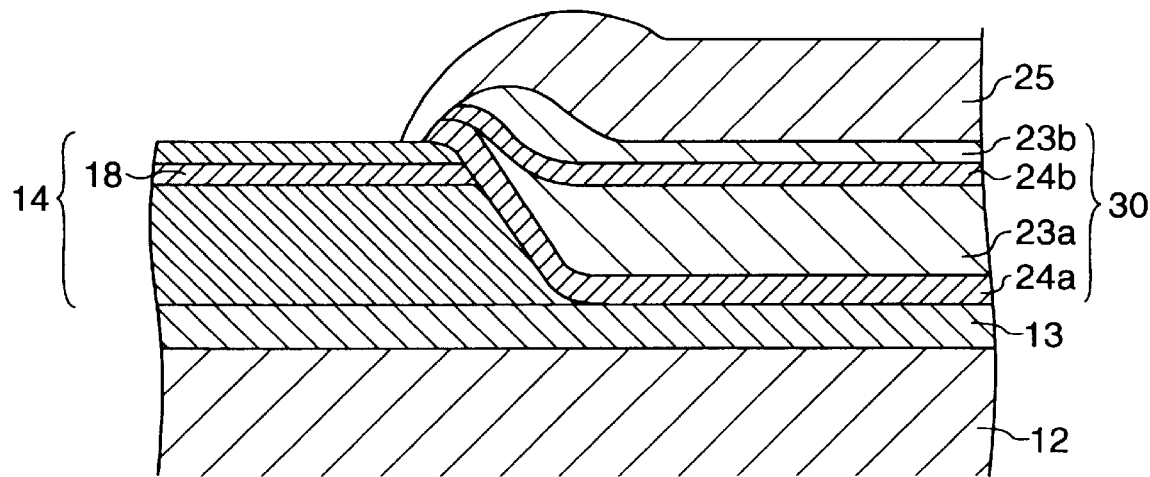
FIG. 15 is a sectional view showing in an exploded manner an essential part of a first modification example of a magneto-resistance effect head shown in FIG. 1A and FIG. 1B.

Now, though, in FIG. 3, the high Ms magnetic layer 24 is used only as an under layer of the hard magnetic layer 23, as shown in FIG. 15, for example, in addition to a first high Ms magnetic layer 24a as a magnetic under layer, a second high Ms magnetic layer 24b can be disposed at an adjacent position of the free layer 18. The second high Ms magnetic layer 24b is disposed in almost parallel with the direction of the free layer 18 and a substrate surface. That is, a hard magnetic biasing film 22 shown in FIG. 15 is made up of a film stacked sequentially a first high Ms magnetic layer 24a as a magnetic under layer, a first hard magnetic layer 23a, a second high Ms magnetic layer 24b, and a second hard magnetic layer 23a. In this case, a condition required for the second high Ms magnetic layer 24b is identical as that of the first high Ms magnetic layer 24a as a magnetic under layer.

Although the second high Ms magnetic layer 24b does not contribute to the exchange bias, by disposing the second high Ms magnetic layer 24b close to the free layer 18, a magnetostatic field bias of a high magnetic flux density can be inputted effectively to the free layer 18. Thus, according to a hard magnetic biasing film 22 consisting of a stacked film between a high Ms magnetic layer 24 and a hard magnetic layer 23, to a free layer 18 of a spin valve GMR film 14 of a reversed structure, a bias magnetic field can be more firmly inputted.

Now, in a hard magnetic biasing film 22 consisting of a stacked film of a high Ms magnetic layer 24 and a hard magnetic layer 23, the high Ms magnetic layer 24 can be disposed only at a neighboring position of the free layer 18.

A shield type GMR head of the above described embodiment, together with filming integrally a hard magnetic biasing film 22 and an electrode 25, is patterned once with the PEP process. Even when the hard magnetic biasing film 22 and the electrode 25 are patterned twice by the PEP process due to high densification, the present invention can be applied identically. A structure of this case is shown in FIG. 16.

Figure 16:
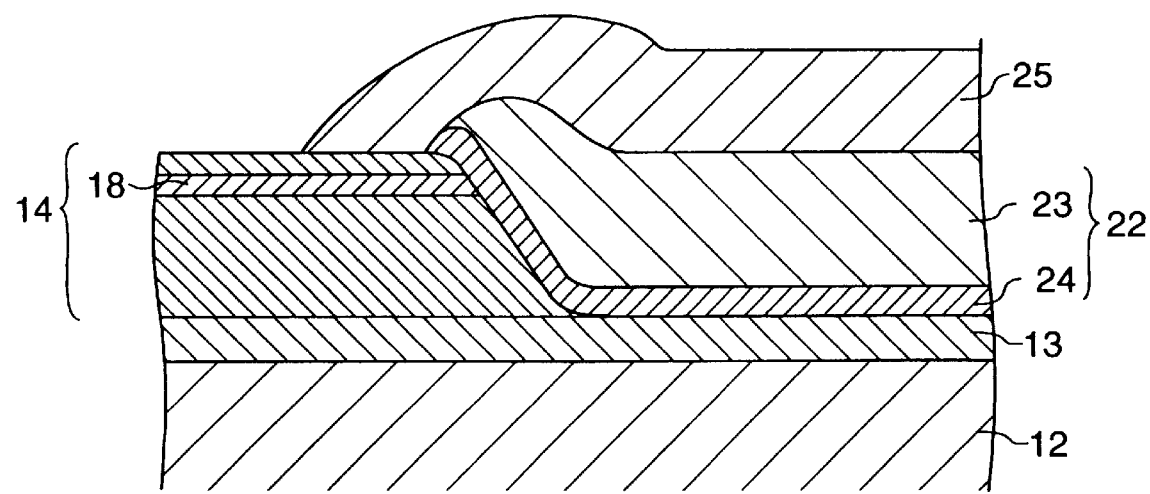
FIG. 16 is a sectional view showing in an exploded manner an essential part of a second modification example of a magneto-resistance effect head shown in FIG. 1A and FIG. 1B.

A shield type GMR head showing the structure of the essential portion in FIG. 16 is formed in such a manner that a part of an electrode 25 is made to be overlapped with a spin valve GMR film 14. In this case, the track width is defined by a spacing between a pair of electrodes 25. According to a shield type GMR head of such a structure, too strong magnetostatic field bias at the center portion of the free layer 18 due to track width narrowing can be circumvented. Further, contact resistance between the electrode 25 and the spin valve GMR film 14 can be decreased. Other specific constitutions or the effect due to them are identical with the above described embodiments.

Figure 17:
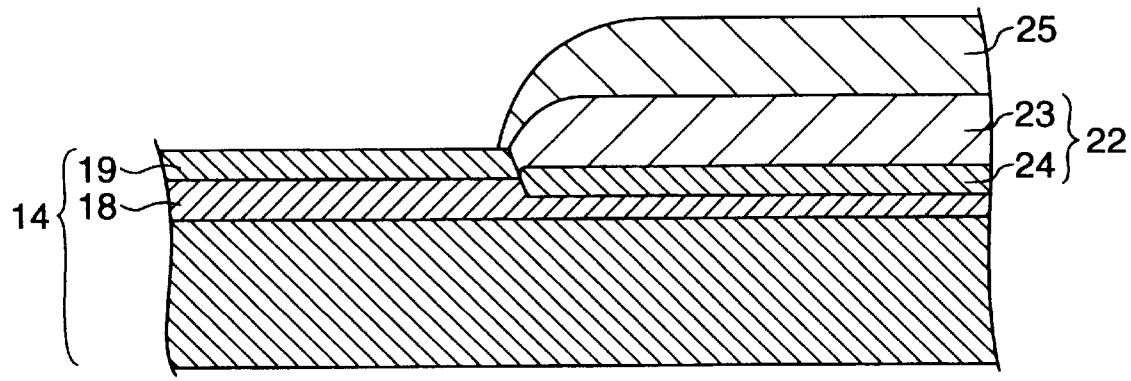
FIG. 17 is a sectional view showing in an exploded manner an essential part of a third modification example of a magneto-resistance effect head shown in FIG. 1A and FIG. 1B.

In addition, in the above described embodiment, a case where the outsides of both edge portions off a track width of a spin valve GMR film 14 are completely removed is described. When a spin valve GMR film 14 of a reversed structure in which a free layer 18 is disposed at the upper side, as shown in FIG. 17, for example, only the protective film 19 such as Ta of the spin valve GMR film 14 can be made to form a shape conformed to a magnetic field detecting portion. That is, only the protective film outside the both edge portions off the track width is etched away.

As described above, by exposing the surface of the free layer 18 of the outsides of the both edge portions off a track width and by forming the films of the high Ms magnetic layer 24 and the hard magnetic layer 23 thereon sequentially, a hard magnetic biasing film 22 is formed. By employing such a structure, a bias structure where the area off a read track of the free layer 18 is directly exchange-coupled with the high Ms magnetic layer 24 can be materialized.

According to such a structure above described, a bias effect due to magnetic flux intruded not only from the edge portion of the read track of the free layer 18 but also from the outside areas of the both edge portions (tail portion) can be expected. Therefore, the bias magnetic field can be more excellently inputted to the free layer 18. Further, other concrete constitutions or the effects by them are identical as that of the above described embodiments.

Further, since the spin valve GMR film 14 takes a structure in which a part of a conductive film of a magnetic multi-layer film constituting the spin valve GMR film 14 remains outside the both edge portions of a track width, through the remained conductive film, the stable electrical contact can be secured, thus, contact resistance can be decreased. Therefore, the resistance of the GMR read element portion 26 can be reduced, even if a large sense current is inputted to enhance read sensitivity, it becomes difficult to be influenced by the thermal noise.

In addition, without making contact the wall surface of the track width edge portion of the pinned layer 16 with the hard magnetic biasing film 22, the bias magnetic field is given to the free layer 18. Therefore, while suppressing the occurrence of Barkhausen noise, a leakage magnetic field being added to the pinned layer 16 from the hard magnetic biasing film 22 can be suppressed. Thereby, since a problem that magnetization of the pinned layer 16 tends to slant toward the direction of the leakage magnetization of the hard magnetic biasing film 22 can be avoided, more excellent linear response characteristics can be obtained.

Figure 18:
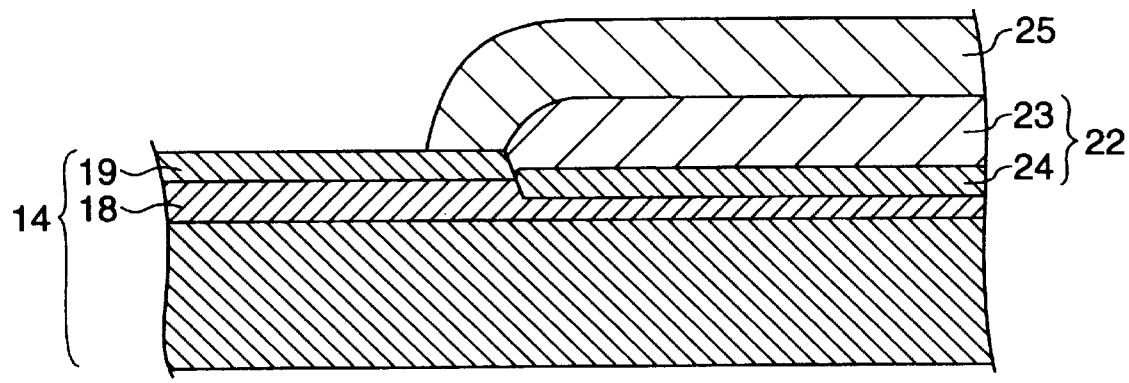
FIG. 18 is a sectional view showing a modification example of a magneto-resistance effect head shown in FIG. 17.

In a bias structure in which the area off the read track of the above described free layer 18 is directly exchange-coupled with the high Ms magnetic layer 24, as shown in FIG. 18, for example, the electrode 25 can be formed to overlap with the spin valve GMR film 14 in part. Such a structure is effective for narrowing the track width as identical as the GMR head shown in FIG. 16.

Figure 19:
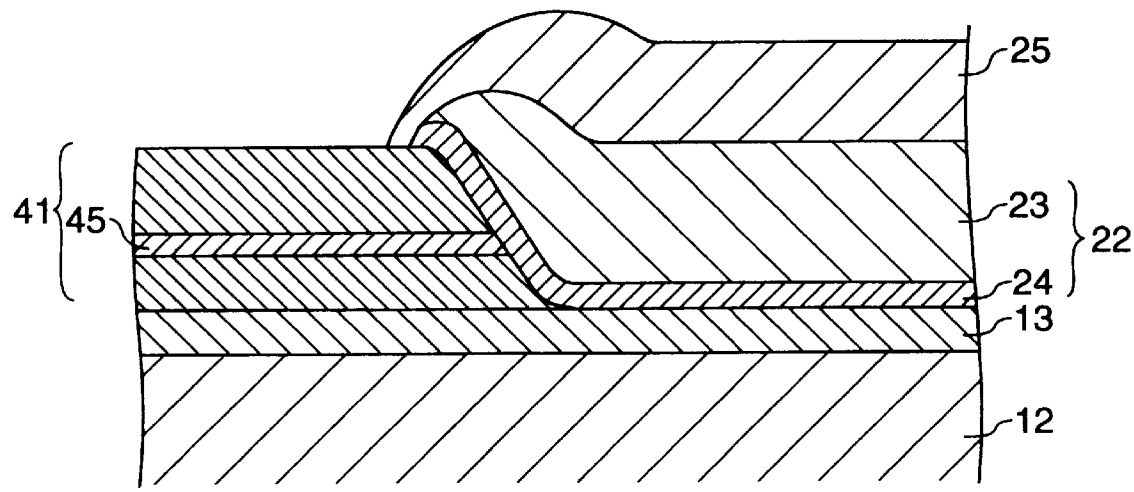
FIG. 19 is a sectional view showing a structure of an essential portion of a first embodiment of a magnetic recording/read separation type head in which a second magneto-resistance effect element of the present invention is applied in a read element portion.
Figure 20:
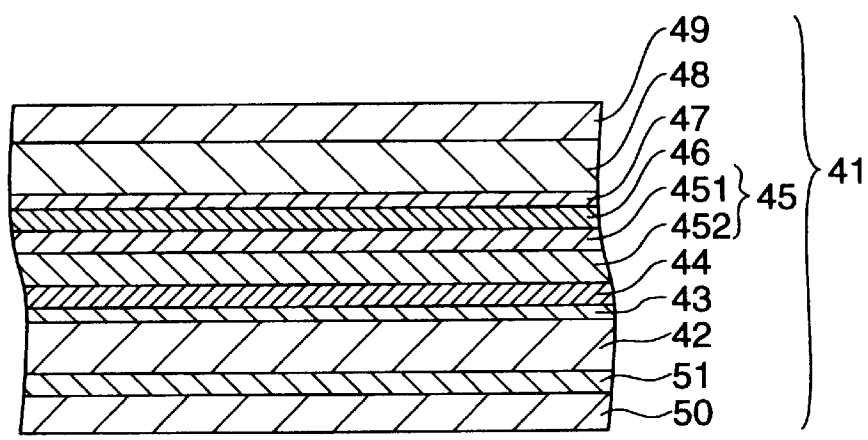
FIG. 20 is a sectional view showing in an exploded manner a magneto-resistance effect film portion of a magneto-resistance effect head shown in FIG. 19.

Next, a second embodiment of a magnetic recording/read separation type head in which an magneto-resistance effect element of the present invention is employed to a read element portion will be described. FIG. 19 is a diagram showing an essential structure of the embodiment in which a second magneto-resistance effect element of the present invention is employed in a magnetic recording/read separation type head identical as FIG. 2. FIG. 20 is a diagram showing the magneto-resistance effect film portion of FIG. 19 in an exploded manner.

In this embodiment, as identical as the embodiment shown in FIG. 2, on a not shown substrate, through a lower magnetic shield layer 12, a lower read magnetic gap 13 is formed. On the lower read magnetic gap 13, a dual element GMR film 41 having one free layer is formed.

The dual element type GMR film 41, as shown in FIG. 20, has a magnetic multi-layer film stacked in turn a first antiferromagnetic layer 42, a first pinned layer 43, a first non-magnetic layer 44, a free layer 45 of which magnetization direction varies according to an external magnetic field, a second non-magnetic layer 46, a second pinned layer 47, and a second antiferromagnetic layer 48. The free layer 45, as identical as the above described embodiment, has a Co containing ferromagnetic layer 451 and a soft magnetic assist layer 452. Here, constituent materials of each layer are identical as those of the above described embodiment.

Further, in the figure, numeral 49 is a protective film, 50 is a non-magnetic under layer, 51 is an under layer having a fcc structure. These are formed as demands arise.

As a specific constitution of a dual element GMR film 41 in which the free layer 45 is single, a constitution stacked from the substrate side in turn Ta (5 nm) 50/IrMn (10 nm) 42/CoFe (2 nm) 43/Cu (3 nm) 44/CoFe (2 nm) /NiFe (5 nm) 451/CoFe (3 nm) 452/Cu (3 nm) 46/CoFe (2 nm) 47/IrMn (8 nm) 48/Ta (5 nm) 49 can be cited.

The dual element GMR film 41 consisting of the above described magnetic multi-layer film has a shape conforming to a magnetic field detecting portion. Outside the edge portions of such dual element GMR film 41, respective hard magnetic biasing film 22 is formed, thereby constitutes a so-called abutted junction structure. The hard magnetic biasing film 22, as identical as the above described embodiment, has a structure stacked in turn a high Ms magnetic layer 24 and a hard magnetic layer 23. Here, the constituent material of each layer constituting the hard magnetic biasing layer 22 is identical as the above described embodiment.

According to a hard magnetic biasing film 22 consisting of a stacked film of a high Ms magnetic layer 24 and a hard magnetic layer 23, as described above, in addition to an exchange bias resulting from exchange-coupling of a free layer 45 and a high Ms magnetic layer 24, a magnetostatic bias of high flux density can be inputted at the edge portion of the free layer 45. Further, variation of magnetization direction of the high Ms magnetic layer 24 as a magnetic under layer due to rotation of the magnetization of the free layer 45 is suppressed. Thus, also to the edge portion of the free layer 45 of the dual element GMR film 41, the bias magnetic field can be inputted with stability and effectively. Thereby, occurrence of Barkhausen noise can be suppressed effectively.

Figure 21:
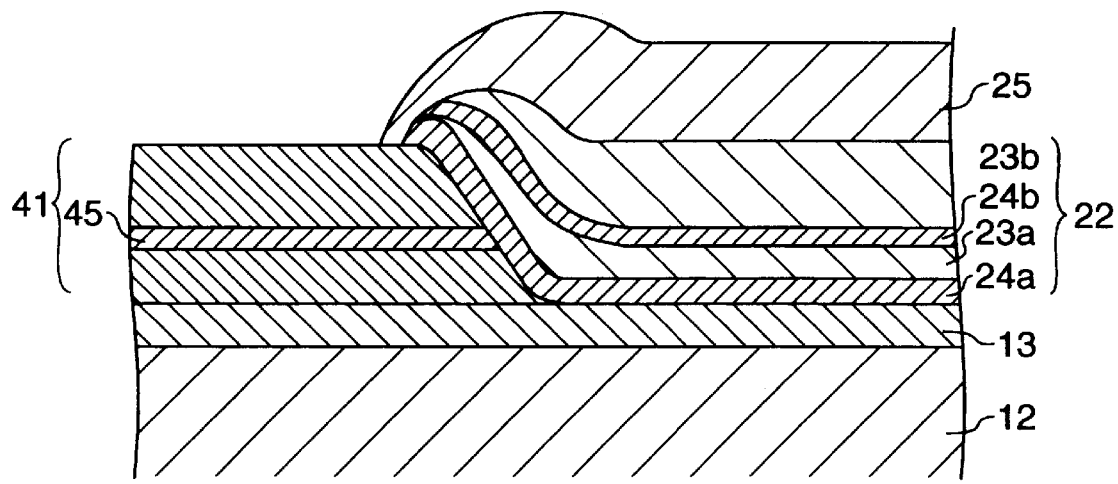
FIG. 21 is a sectional view showing an essential portion of a first modification example of a magneto-resistance effect head shown in FIG. 19.

Even in a GMR head in which a dual element GMR film 41 having a single free layer 45 is employed, as identical as the case of the spin valve GMR film 14 of the above described reversed structure, various kinds of modifications are possible. For example, as shown in FIG. 21, the hard magnetic biasing film 22 can be constituted by a laminate film stacked in turn a first high Ms magnetic layer 24a as a magnetic under layer, a first hard magnetic layer 23a, a second high Ms magnetic layer 24b and a second hard magnetic layer 23b. In this case, even to a dual element GMR film 41 in which the free layer 45 is located around center portion, the second high Ms magnetic layer 24b can be easily disposed close to the free layer 45.

Figure 22:
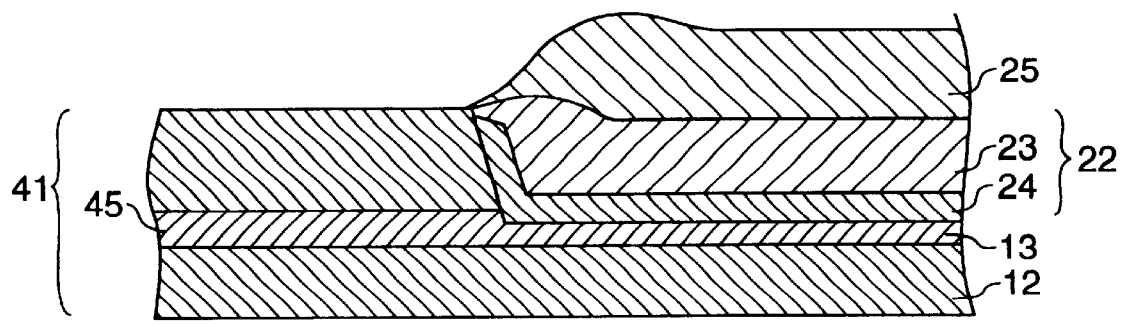
FIG. 22 is a sectional view showing an essential portion of a second modification example of a magneto-resistance effect head shown in FIG. 19.
Figure 23:
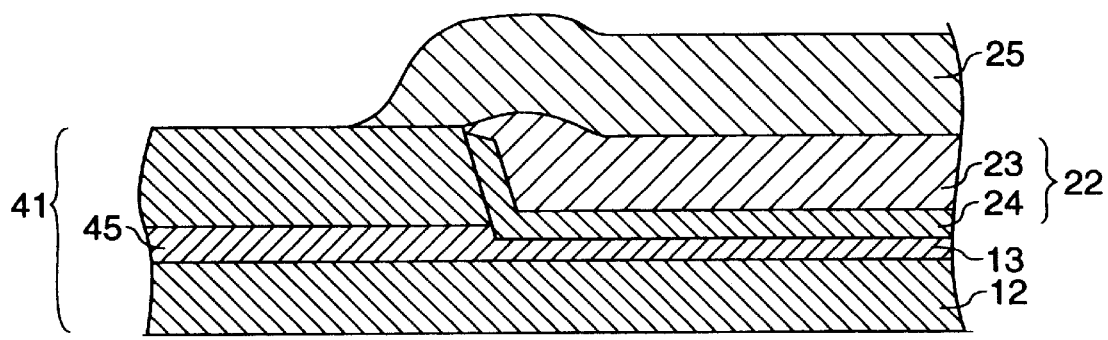
FIG. 23 is a sectional view showing a modification example of a magneto-resistance effect head shown in FIG. 22.

As shown in FIG. 22 and FIG. 23, among a magnetic multi-layer film constituting a dual element GMR film 41, by, for example, etching away the outside of the both edge portions off a track width of the portion upper than a free layer 45, a surface of the free layer 45 is exposed. Thereon, a high Ms magnetic layer 24 and a hard magnetic layer 23 are formed into a film in turn to make up a hard magnetic biasing film 22. Such a structure can be available. In any one of such biasing structures, a bias magnetic field can be more excellently inputted to the free layer 45. In addition, in FIG. 23, an electrode 25 is formed to overlap in part with the dual element GMR film 41.

Figure 24:
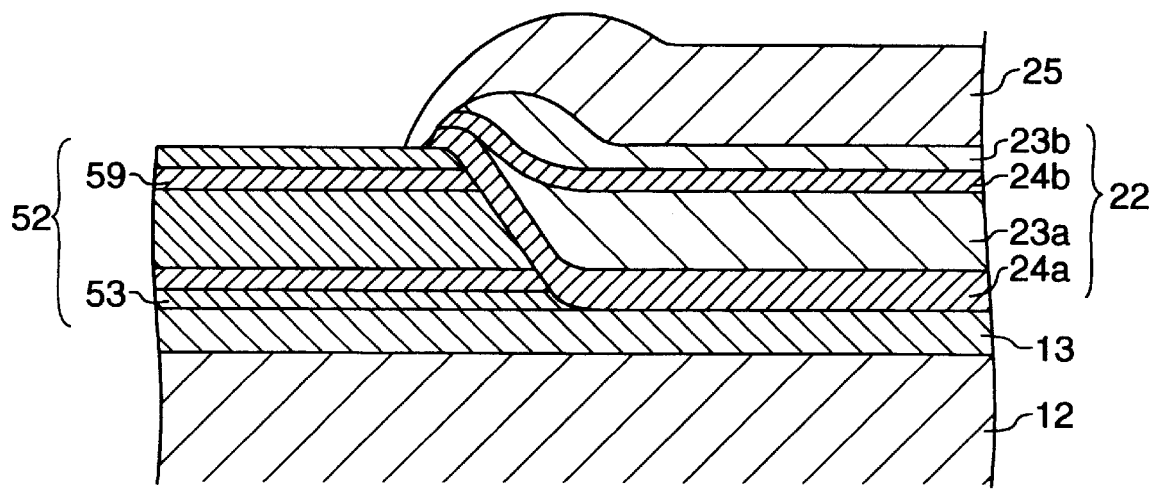
FIG. 24 is a sectional view showing a structure of an essential portion of a second embodiment of a magnetic recording/read separation type head in which a second magneto-resistance effect element of the present invention is applied in a read element portion.
Figure 25:
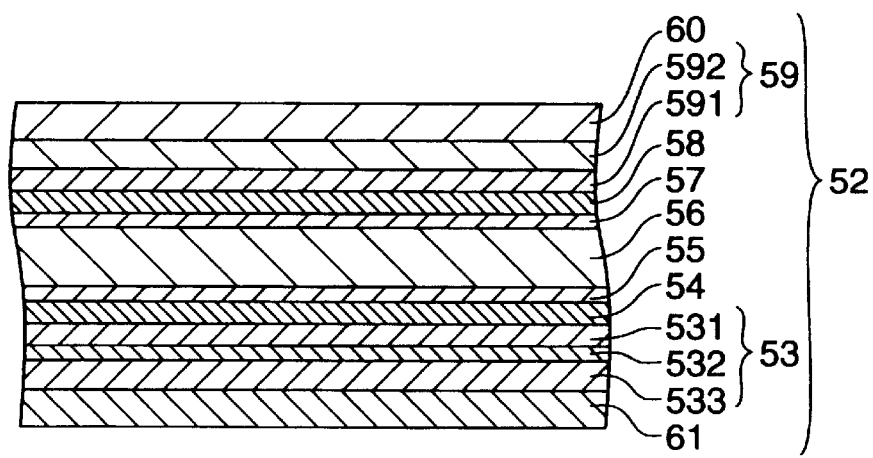
FIG. 25 is a sectional view showing in an exploded manner a magneto-resistance effect film portion of a magneto-resistance effect head shown in FIG. 24.

Next, a third embodiment of a magnetic recording/read separation type head in which the magneto-resistance effect element of the present invention is employed for a read element portion will be described. FIG. 24 is a diagram showing an essential structure of another embodiment where a second magneto-resistance effect element of the present invention is employed for a magnetic recording/read separation type head identical as FIG. 2. FIG. 25 is a diagram showing a magneto-resistance effect element portion of FIG. 24 in an exploded manner.

In this embodiment, as identical as the embodiment shown in FIG. 2, on a not shown substrate, through a lower magnetic shield layer 12, a lower read magnetic gap 13 is formed. On this lower read magnetic gap 13, a dual element type GMR film 52 having 2 free layers is formed.

The dual element type GMR film 52, as shown in FIG. 25, has a magnetic multi-layer film stacked in turn a first free layer 53 of which magnetization direction varies according to an external magnetic field, a first non-magnetic layer 54, a first pinned layer 55, an antiferromagnetic layer 56, a second pinned layer 57, a second non-magnetic layer 58, and a second free layer 59 of which magnetization direction varies according to an external magnetic field.

The first and the second free layer 53, 59 have a constitution identical as the above described embodiment. The first free layer 53 has a Co containing ferromagnetic layer 531 and 2 layers of soft magnetic assist layers 532, 533. The second free layer 59 has a Co containing ferromagnetic layer 591 and a soft magnetic assist layer 592. Here, the constituent material of each layer is identical as the above described embodiment. Further, in the figure, numeral 60 is a protective film, numeral 61 is a non-magnetic under layer. These are formed as demand arises.

As a specific constitution of a dual element GMR film 52 having 2 free layers of the free layer 53, 59, a constitution stacked from the substrate side in turn Ta (5 nm) 61/amorphous CoZrNb (5 nm) 533/NiFe (2 nm) 532/CoFe (3 nm) 531/Cu (3 nm) 54/CoFe (2 nm) 55/IrMn (8 nm) 56/CoFe (2 nm) 57/Cu (3 nm) 58/CoFe (3 nm) 591/NiFe (5 nm) 592/Ta (5 nm) 60 can be cited.

The dual element GMR film 52 consisting of the above described magnetic multi-layer film has a shape conforming to the magnetic field detecting portion. For example, the portion off the track width of the dual element GMR film 52 is etched away. Outside the edge portion of such a dual element GMR film 52, respective hard magnetic biasing film 22 is formed, thereby constitutes a so-called abutted junction structure.

The hard magnetic biasing film 22, as identical as the above described embodiment, is made up of a stacked film of a high Ms magnetic layer 24 and a hard magnetic layer 23. That is, the hard magnetic biasing film 22 has a film stacked in turn a first high Ms magnetic layer 24a as a magnetic under layer, a first hard magnetic layer 23a, a second high Ms magnetic layer 24b and a second hard magnetic layer 23b. In this case, also even to a dual element GMR film 52 having 2 free layers 53, 59, around neighboring area of each free layer 53, 59, the high Ms magnetic layers 24a, 24b can be easily disposed, respectively. Here, the constituent material of each layer constituting the hard magnetic biasing layer 22 is identical as that of the above described embodiment.

According to a hard magnetic biasing film 22 consisting of a stacked film of a high Ms magnetic layer 24 and a hard magnetic layer 23, as described above, in addition to an exchange bias resulting from exchange-coupling of a first and second free layer 53, 59 and a first high Ms magnetic layer 24a, a magnetostatic bias of a high flux density can be inputted at the edge portions of the first and second free layer 53, 59 from the first and the second high Ms magnetic layer 24a, 24b. Further, variation of magnetization directions of the first high Ms magnetic layer 24a as the magnetic under layer due to rotation of the magnetization of the first and the second free layer 53, 59 is suppressed. Thus, also to the edge portions of the 2 free layer 53, 59 of the dual element GMR film 52, respective bias magnetic field can be inputted with stability and effectively. Thereby, occurrence of Barkhausen noise due to magnetic domain formation at the edge portions of the 2 free layer 53, 59 can be suppressed effectively.

Figure 26:
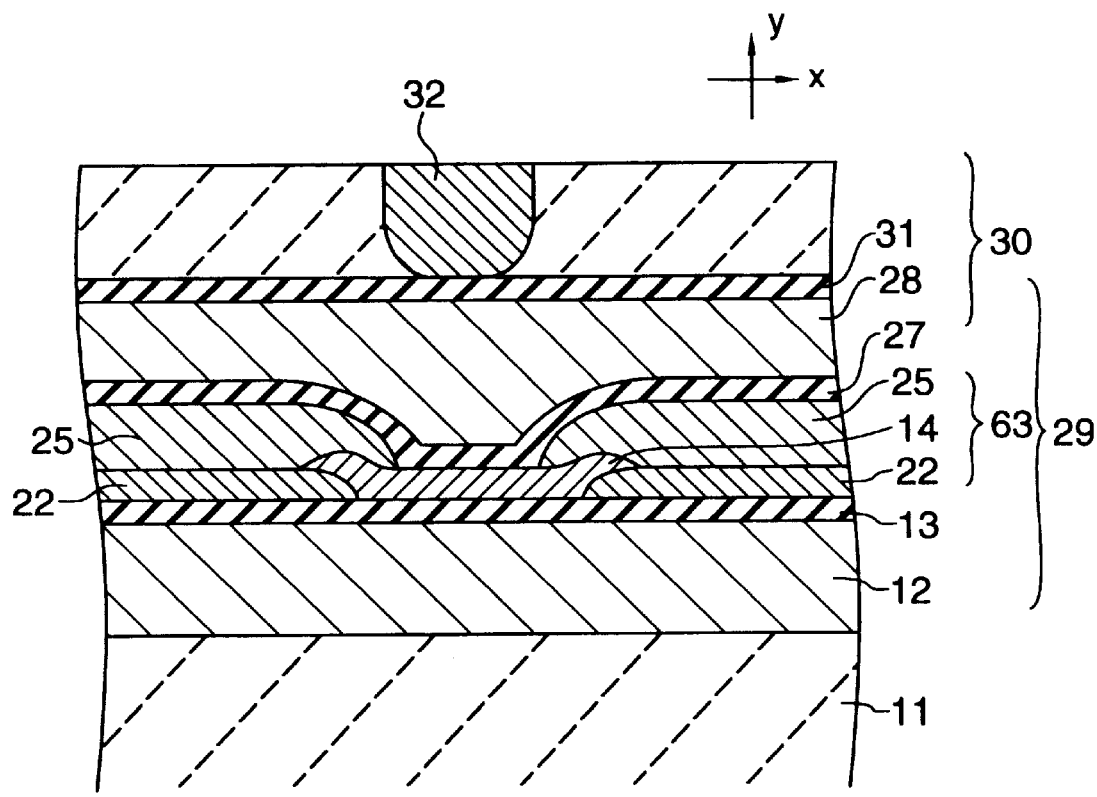
FIG. 26 is a sectional view showing a structure of a second embodiment of a magnetic recording/read separation type head in which a first magneto-resistance effect element of the present invention is applied in a read element portion.
Figure 27:
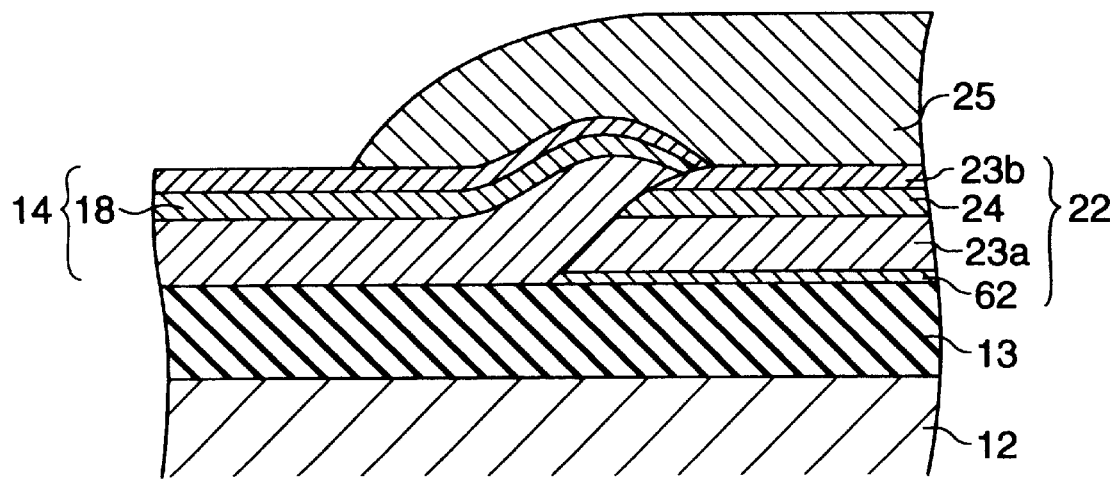
FIG. 27 is a sectional view showing in an exploded manner an essential portion of a magneto-resistance effect head in a magnetic recording/read separation type head shown in FIG. 26.

Next, a fourth embodiment of a magnetic recording/read separation type head in which a magneto-resistance effect element of the present invention is applied to a read element portion will be described. FIG. 26 and FIG. 27 are diagrams showing structures of the embodiments in which a first magneto-resistance effect element of the present invention is applied to an overlaid structure. FIG. 26 is a sectional view seen from an air bearing surface direction of a magnetic recording/read separation type head. In FIG. 26, x-direction is a recording track width direction, y-direction is a recording track running direction which corresponds to the film thickness direction. FIG. 27 is a sectional view of an essential portion of FIG. 26 shown in an exploded manner. In FIG. 27, the spin valve GMR film 14 is shown by omitting a film constitution other than the free layer 18.

In the magnetic recording/read separation type head of this embodiment, as identical as the embodiment shown in FIG. 2, on one main surface of a substrate 11, a lower magnetic shield layer 12 and a lower read magnetic gap 13 are formed in turn. On the lower read magnetic gap 13, a spin valve GMR film 14 of a reversed structure of which constitution is shown in FIG. 4 is formed. Between the spin valve GMR film 14 and the lower read magnetic gap 13, on the area off the track width, a pair of hard magnetic biasing films 22 for inputting in advance a bias magnetic field to the spin valve GMR film 14 are formed. The pair of the hard magnetic biasing films 22 are disposed with a predetermined spacing. Namely, both edge portions of the spin valve GMR film 14 are stacked on the pair of hard magnetic biasing films 22.

Figure 28:
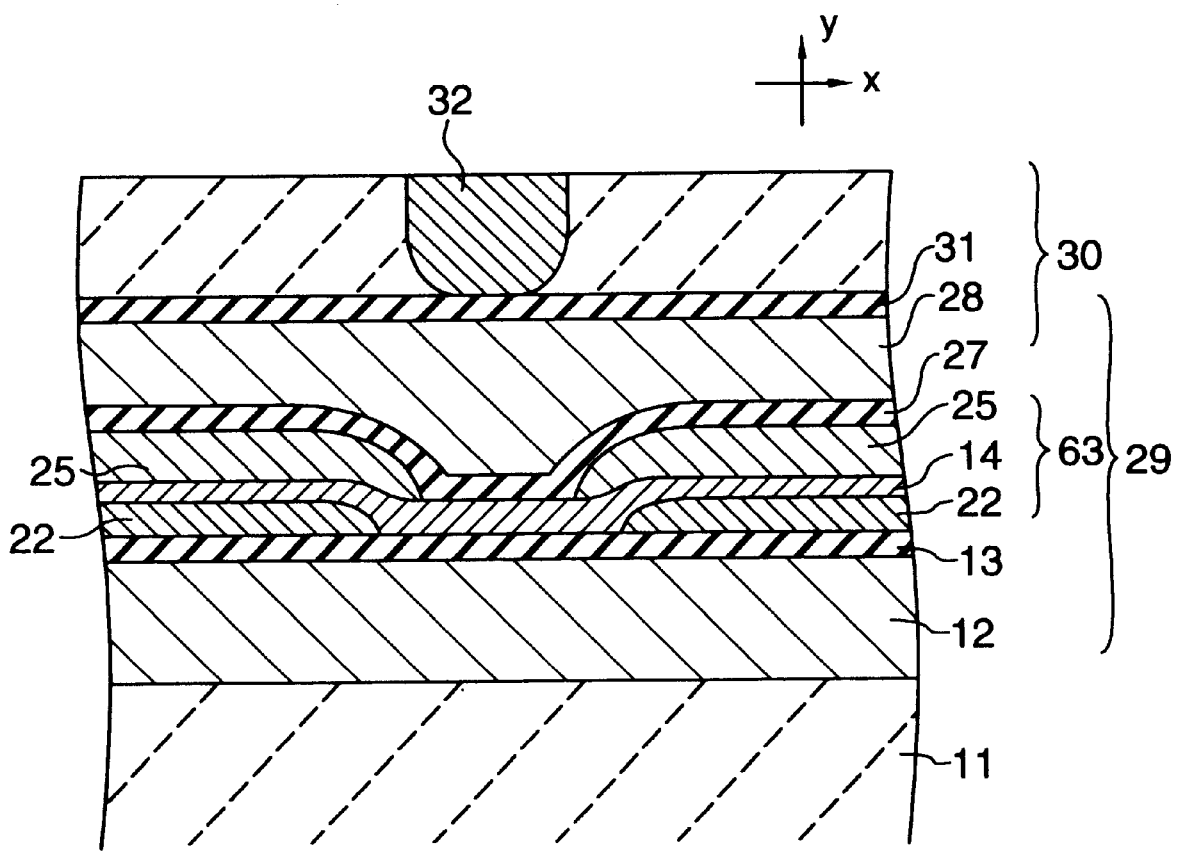
FIG. 28 is a sectional view showing a structure of a first modification example of a magnetic recording/read separation type head shown in FIG. 26.

Here, in a stacked structure of a spin valve GMR film 14 and a hard magnetic biasing films 22, as shown in FIG. 28, the outside portions of the read track of the spin valve GMR film 14 can be respectively stacked on the hard magnetic biasing films 22.

The hard magnetic biasing film 22 is constituted of, as shown in FIG. 27, a film stacked in turn a first hard magnetic layer 23a, a high Ms magnetic layer 24 and a second hard magnetic layer 23b. The high Ms magnetic layer 24 is disposed close to the free layer 18. The hard magnetic biasing film 22 is formed on a non-magnetic under layer 62 consisting of Cr, for instance. The non-magnetic under layer 62 is formed as demands arise.

On the spin valve GMR film 14, a pair of electrodes 25 are formed. A substantial read track width of a spin valve GMR film 14 is defined by a spacing between the pair of electrodes 25. These of the spin valve GMR film 14, a pair of hard magnetic biasing films 22 and a pair of electrodes 25 constitute a GMR read element portion 63 of an overlaid structure. Further, the constitution other than relative position of the spin valve GMR film 14 and the hard magnetic biasing film 22, and formation position of the pair of electrodes 25 is constituted identical as the above described embodiment shown in FIG. 2. In addition, the constituent materials of each layer and others are identical as the above described embodiment.

The above described GMR read element portion 63 is produced by, for example, the following manner. That is to say, on a lower read magnetic gap 13 consisting of $AlO_x$ and the like, a non-magnetic under layer 62, a first hard magnetic layer 23a, a high Ms magnetic layer 24 and a second hard magnetic layer 23b are made in film in turn. By milling after PEP process is executed to the stacked film, a pair of hard magnetic biasing films 22 are patterned to be disposed with a predetermined spacing. In this case, normally by setting a spacing of a pair of hard magnetic biasing films 22 broader than that of a pair of electrodes 25, with the spacing of the pair of electrodes 25 a substantial read track width of the spin valve GMR film 14 is provided. Patterning of the hard magnetic biasing films 22 can be executed by a lift-off method.

Then, on the pair of patterned hard magnetic biasing films 22, each layer constituting the spin valve GMR film 14 is formed in film in turn. By milling after executing the PEP process to the magnetic multi-layer film, the spin valve film GMR film 14 is patterned. Patterning of the spin valve GMR film 14 can be executed by the lift-off method as identical as the hard magnetic biasing films 22. Thereafter, a conductive film destined to be an electrode 25 is patterned by the lift-off method to form a pair of electrodes 25. Thus, a GMR read element portion 63 of an overlaid structure is obtained. In the GMR read element portion 63 of the overlaid structure, since the spin valve GMR film 14 and the electrode 25 contact at the film surface, the read resistance decreases to result in an advantage of not causing electro-static destruction (ESD).

In a shield type GMR head 29 in which a GMR read element portion 63 of the above described overlaid structure is applied, when a spin valve GMR film 14 of a reversed structure of which free layer 18 is disposed at the upper side is employed, a particularly effective bias magnetic field becomes difficult to obtain. Concerning to such a point, a hard magnetic biasing films 22 consisting of a stacked film formed between the hard magnetic layer 23 and the high Ms magnetic layer 24 can input effectively a bias magnetic field to the edge portion of the free layer 18 which is disposed at upper side.

That is, though the effect due to exchange-coupling between the free layer 18 and the high Ms magnetic layer 24 can not be obtained, since the high Ms magnetic layer 24 is disposed near to the free layer 18, a magnetostatic bias of high magnetic flux density can be inputted from the high Ms magnetic layer 24. Therefore, to the edge portion of the free layer 18 of the spin valve GMR film 14 in which an overlaid structure is applied, a bias magnetic field can be inputted with stability and effectively. Thereby, occurrence of Barkhausen noise due to magnetic domain formation at the edge portion of the free layer 14 can be effectively suppressed.

Figure 29:
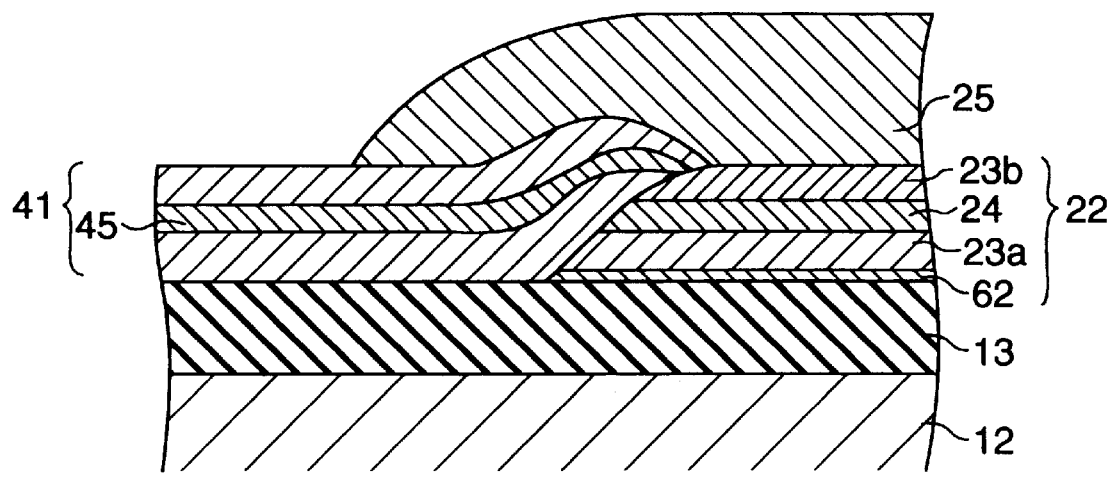
FIG. 29 is a sectional view showing an essential portion of a second modification example of a magneto-resistance effect head shown in FIG. 26.
Figure 30:
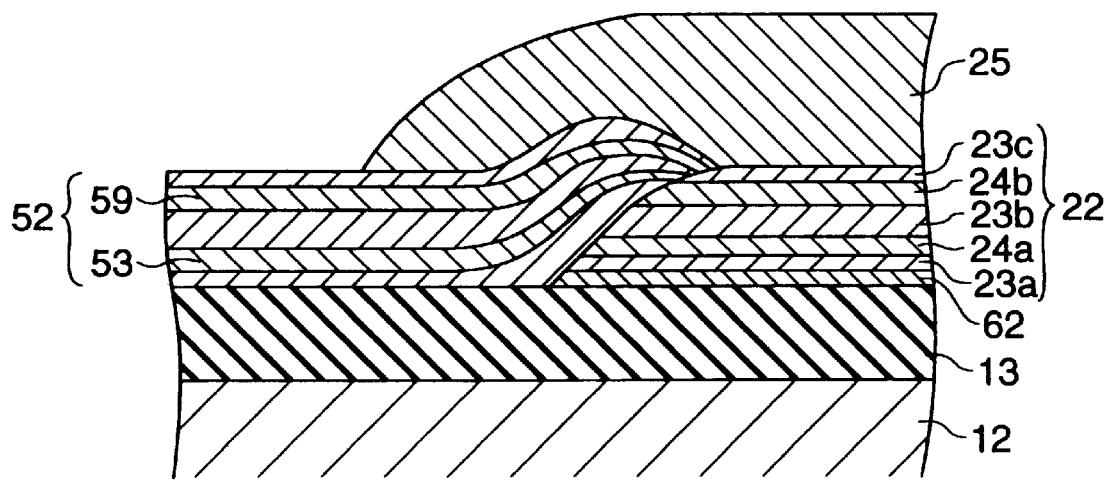
FIG. 30 is a sectional view showing an essential portion of a third modification example of a magneto-resistance effect head shown in FIG. 26.

Even when a dual element GMR film 41 in which a free layer 45 is located around a center portion as shown in FIG. 20 or a dual element GMR film 52 having 2 free layers 53, 59 shown in FIG. 25 is employed, it is difficult to obtain effective bias with the overlaid structure. As to these points, as shown in FIG. 29 and FIG. 30, according to a hard magnetic biasing films 22 consisting of a stacked film of the hard magnetic layer 23 and the high Ms magnetic layer 24, the high Ms magnetic layer 24 can be disposed corresponding to positions of each free layer 45, 53, 59. Therefore, to the edge portions of free layer 45, 53, 59 of the dual element GMR film 41, 52, the bias magnetic field can be inputted with stability and effectively. Even when the dual element GMR film 41, 52 are employed, occurrence of Barkhausen noise can be effectively suppressed.

In addition, when being formed the high Ms magnetic layer 24 with 3 or more layers, a hard magnetic layer 23 can be inserted between the high Ms magnetic layers to form a bias film. Such a bias film can be employed as a bias film of an artificial lattice GMR film in which a plurality of magnetic layers are stacked for receiving bias, for example, and by disposing the high Ms magnetic layer while coordinating its position with the magnetic layer of which magnetization direction varies, an excellent effect can be obtained.

Next, an embodiment of a fourth magneto-resistance effect element of the present invention will be described with reference to FIG. 31, FIG. 32, FIG. 33, FIG. 34, FIG. 35, FIG. 36, FIG. 37 and FIG. 38.

Figure 31:
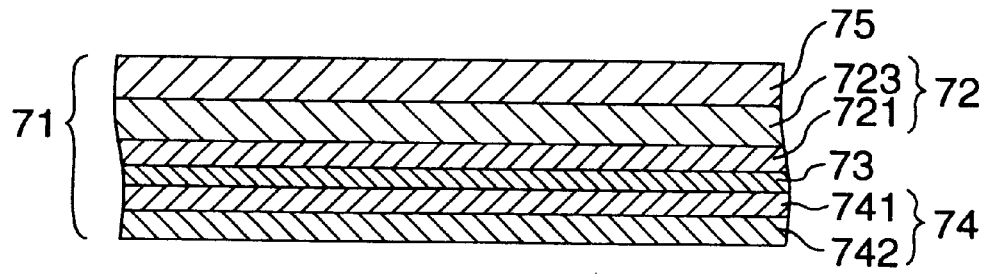
FIG. 31 is a sectional view showing a structure of an essential portion of a first embodiment of a fourth magneto-resistance effect element of the present invention.

FIG. 31 is a sectional view showing an essential portion of a GMR element of the embodiment, and showing a constitution of a spin valve GMR film 71. The spin valve GMR film 71 has a magnetic multi-layer film stacked a free layer 72 of which magnetization direction varies according to an external magnetic field, a non-magnetic layer 73 consisting of Cu, Au, Ag and alloys formed therebetween, and a pinned layer 74. The pinned layer 74 is disposed at the lower side.

The free layer 72 has a Co containing ferromagnetic layer 721 such as a CoFe alloy layer, for example. The Co containing ferromagnetic layer 721 is disposed contacting a non-magnetic layer 73. On the Co containing ferromagnetic layer 721, to enhance the soft magnetic properties as the free layer 72, a soft magnetic assist layer is formed. For the soft magnetic assist layer, a soft magnetic material having a face-centered cubic crystal structure such as a NiFe alloy, a NiFeCo alloy, the magnetic alloys obtained by adding various kinds of additional elements thereto, or an amorphous based soft magnetic material can be preferably employed. In the embodiment, at the upper side of the Co containing ferromagnetic layer 721, a NiFe alloy layer 723 is disposed as a soft magnetic assist layer.

The pinned layer 74 is constituted of a stacked film formed between a Co based hard magnetic layer 741 consisting of a Co containing hard magnetic material such as a CoPt alloy or a CoCrPt alloy, for example, and a non-hard magnetic layer 742 consisting of such as an FeCo alloy layer. In this embodiment, on the non-hard magnetic layer 742 consisting of such as an FeCo alloy layer, a Co based hard magnetic layer 741 is stacked. The non-hard magnetic layer 742 is disposed on the side where that does not contact the non-magnetic layer 73. Here, in the figure, numeral 75 designates a 2 protective layer consisting of such as Ta, Ti, and is formed as demands arise.

Figure 32:
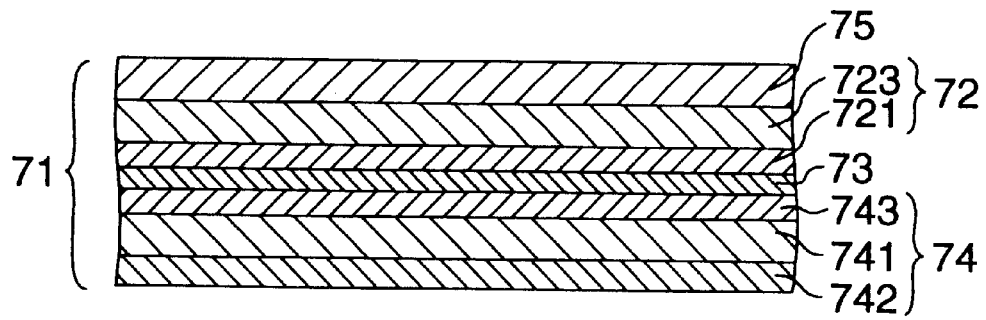
FIG. 32 is a sectional view showing a structure of an essential portion of a first modification example of a magneto-resistance effect element shown in FIG. 31.

Further, as shown in FIG. 32, a CoFe alloy layer 743 can be interposed between a Co based hard magnetic layer 741 and a non-magnetic layer 73. The CoFe alloy layer 743 prevents a Co based hard magnetic layer 741 from being disposed directly on the side of the non-magnetic layer 73.

As a specific constitution of a spin valve GMR film 71 shown in FIG. 31, a constitution stacked from the substrate side in turn FeCo (3 nm) 742/CoPt (3 nm) 741/Cu (3 nm) 73/CoFe (3 nm) 721/NiFe (5 nm) 723/Ta (5 nm) 75 can be cited. As a specific constitution of a spin valve GMR film 71 shown in FIG. 32, a constitution stacked from the substrate side in turn FeCo (3 nm) 742/CoPt (5 nm) 741/CoFe (3 nm) 743/Cu (3 nm) 73/CoFe (3 nm) 721/NiFe (5 nm) 723/Ta (5 nm) 75 can be cited.

The pinned layer 74 consisting of a stacked film of a non-hard magnetic layer 742 consisting of an FeCo alloy layer and the like and a Co based hard magnetic layer 741, as explained in the above described embodiment as a hard magnetic biasing film, is high in its squareness ratio (=Mr/Ms) and excellent in its in-plane component of the magnetic moment. Due to increase of the in-plane component of the pinned layer 74 employing a Co based hard magnetic layer 741, an influence of the ferromagnetic coupling between a pinned layer 74 and a free layer 72 disposed through a non-magnetic layer 73, that was a problem in a spin valve film employing a conventional hard magnetic film, can be remarkably reduced. Therefore, by a spin valve GMR film 71 in which a Co based hard magnetic layer 741 is employed in a pinned layer 74, an excellent magneto-resistance effect characteristics can be obtained.

Figure 33:
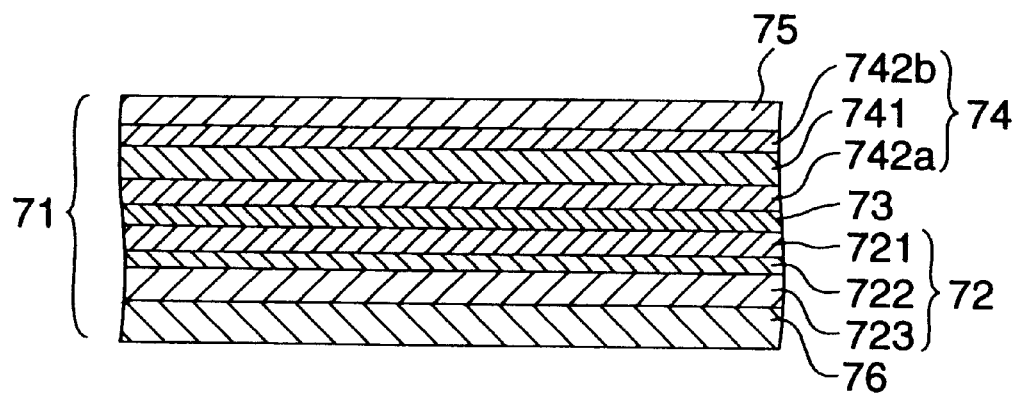
FIG. 33 is a sectional view showing a structure of an essential portion of a second modification example of a magneto-resistance effect element shown in FIG. 31.

As shown in FIG. 33, when the pinned layer is disposed at the upper side, a film stacked in turn an FeCo alloy layer 742a, a Co based hard magnetic layer 741 and a NiFe alloy layer 742b can be employed. In this case, an weak perpendicular component of a Co based hard magnetic layer 741 is shielded by an FeCo alloy layer 742a. In particular, since an FeCo alloy layer 742a is also disposed on the side of the non-magnetic layer 73, due to the shield effect at the interface on the side of the non-magnetic layer 73, the in-plane component of the pinned layer 74 employing a Co based hard magnetic layer 741 becomes large. Here, numeral 722 is a NiFe alloy layer as a soft magnetic assist layer, 723 is in the same way a NiFe alloy layer as a soft magnetic assist layer.

As a specific constitution of a spin valve GMR film 71 shown in FIG. 33, a constitution stacked from the substrate side in turn Ta (5 nm) 76/amorphous CoZrNb (5 nm) 723/NiFe (2 nm) 722/CoFe (3 nm) 721/Cu (3 nm) 73/FeCo (3 nm) 742a/CoPt (5 nm) 741/NiFe (2 nm) 742b/Ta (5 nm) 75 can be cited. With a spin valve GMR film 71 of such a structure, an excellent magneto-resistance effect characteristics can be obtained.

For the non-hard magnetic layer 742, an FeCo alloy, an FeCr alloy, an FeV alloy, an FeZr alloy, an FeZrN alloy, an amorphous CoZrNb alloy can be used. Among them, an FeCo alloy which promotes particularly the in-plane hard magnetic properties of the hard magnetic layer 741 such as CoPt stacked thereon can be preferably employed. As a specific composition of an FeCo alloy, an FeCo composition containing Co in the range of 5 to 40 at % is particularly preferable, being corrosion resistant as well as being excellent in its high squareness ratio (=Mr/Ms) as described above.

In FIG. 31, FIG. 32 and FIG. 33, embodiments where a pinned layer consisting of a stacked film of a Co based hard magnetic layer and a non-hard magnetic layer is employed in a conventional spin valve GMR film 71 are displayed. The pinned layer consisting of a film stacked a Co based hard magnetic layer and a non-hard magnetic layer, as shown in FIG. 34, FIG. 35 and FIG. 36, can be employed to a dual element GMR film.

Figure 34:
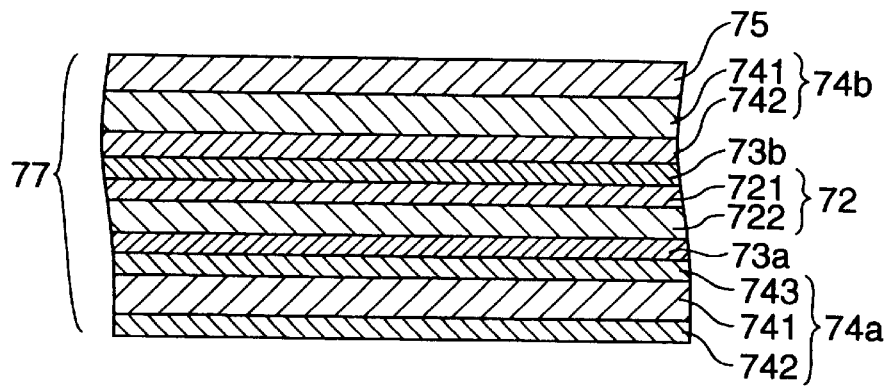
FIG. 34 is a sectional view showing a structure of an essential portion of a second embodiment of a fourth magneto-resistance effect element of the present invention.

FIG. 34 shows a structure of a dual element GMR film 77 of which free layer is one. The dual element GMR film 77 has a magnetic multi-layer film stacked in turn, a first pinned layer 74a employing, for example, a Co based hard magnetic layer 741, a first non-magnetic layer 73a, a free layer 72, a second non-magnetic layer 73b, and a second pinned layer 74b employing a Co based hard magnetic layer 741. The first pinned layer 74a has a structure of FeCo (3 nm) 742/CoPt (5 nm) 741/CoFe (3 nm) 743. The first and the second non-magnetic layer 73a, 73b are formed of Cu (3 nm), respectively. The free layer 72 has a structure of NiFe (5 nm) 722/CoFe (3 nm) 721. The second pinned layer 74b has a structure of FeCo (3 nm) 742/CoPt (5 nm) 741. Even in the dual element GMR film 77 of such a structure, excellent magneto-resistance effect properties can be obtained.

Figure 35:
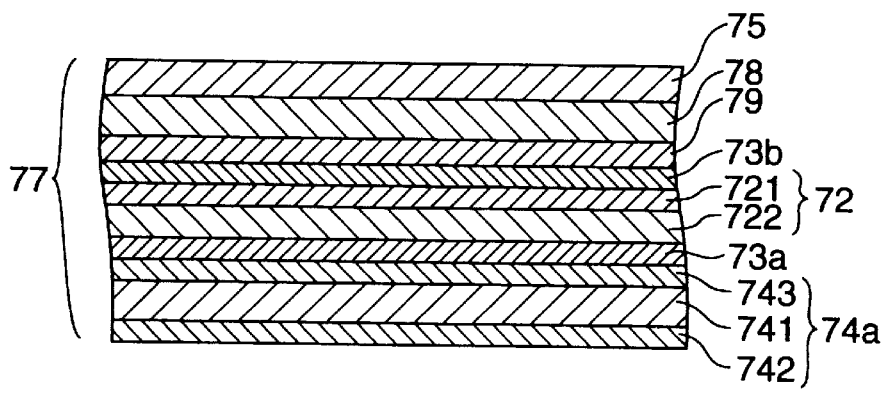
FIG. 35 is a sectional view showing a structure of an essential portion of a first modification example of a magneto-resistance effect element shown in FIG. 34.

In the above described dual element GMR film 771 as shown in FIG. 35, for one pinned layer (the second pinned layer 74b, for example), a ferromagnetic layer 79 such as a CoFe alloy layer pinned by a generally employed antiferromagnetic layer 78 can be applied.

Figure 36:
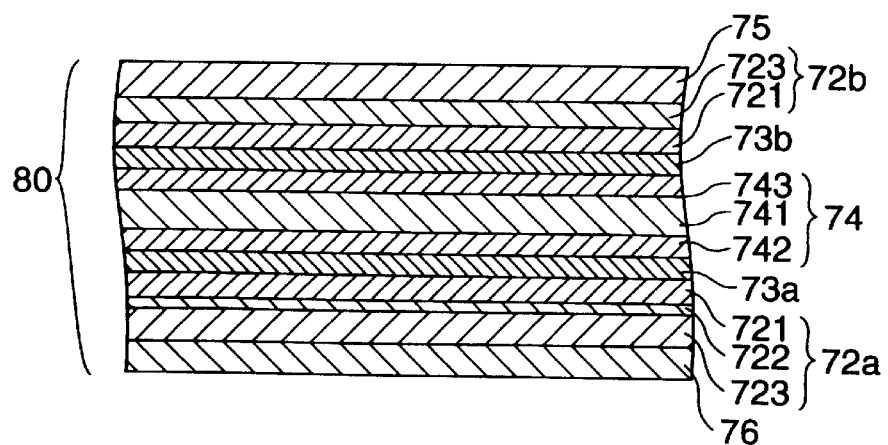
FIG. 36 is a sectional view showing a structure of an essential portion of a third embodiment of a fourth magneto-resistance effect element of the present invention.

FIG. 36 shows a constitution of a dual element GMR film 80 having 2 free layers. The dual element GMR film 80 has a magnetic multi-layer film stacked in turn, for example, a first free layer 72a, a first non-magnetic layer 73a (Cu (3 nm)), a pinned layer 74 employing a Co based hard magnetic layer 741, a second non-magnetic layer 73b, and a second free layer 72b. The first free layer 72a has a structure of amorphous CoZrNb (5 nm) 723/NiFe (2 nm) 722/CoFe (3 nm) 72. The first and the second non-magnetic layer 73a, 73b are made of Cu (3 nm), respectively. The pinned layer 74 has a structure of FeCo (3 nm) 742/CoPt (5 nm) 741/CoFe (3 nm) 743. The second free layer 72b has a structure of CoFe (3 nm) 721/amorphous CoZrNb (5 nm) 723. In a dual element GMR film 80 of such a structure, excellent magneto-resistance effect properties can be obtained.

Even when one of the GMR films shown in FIG. 31, FIG. 32, FIG. 33, FIG. 34, FIG. 35 and FIG. 36 is applied to a GMR head, a head structure shown in FIG. 2 or FIG. 26 can be used. However, in a GMR film having a pinned layer 74 employing a hard magnetic layer 741, when a hard magnetic biasing film is used for controlling the magnetic domain of the free layer, it becomes difficult to materialize an orthogonal magnetization arrangement between the free layer and the pinned layer. Therefore, as shown in FIG. 37 and FIG. 38, it is preferable to use an antiferromagnetic layer 81 consisting of such as an IrMn alloy as a hard magnetic biasing film for controlling magnetic domain of the free layer 72.

Figure 37:
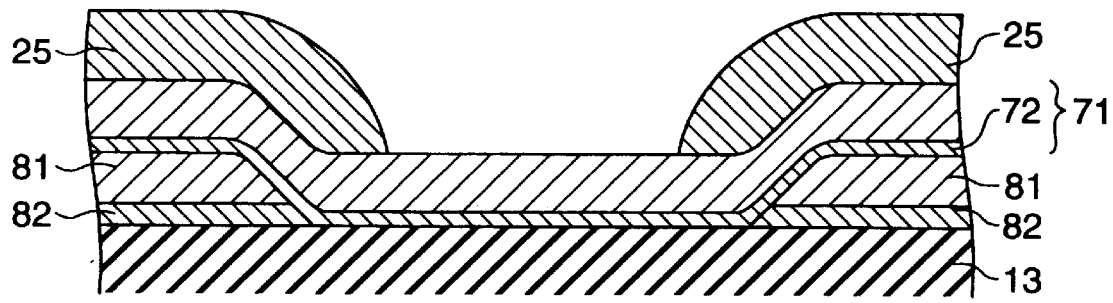
FIG. 37 is a sectional view of an essential portion showing an example of a structure where a fourth magneto-resistance effect element of the present invention is applied in a magneto-resistance effect head.
Figure 38:
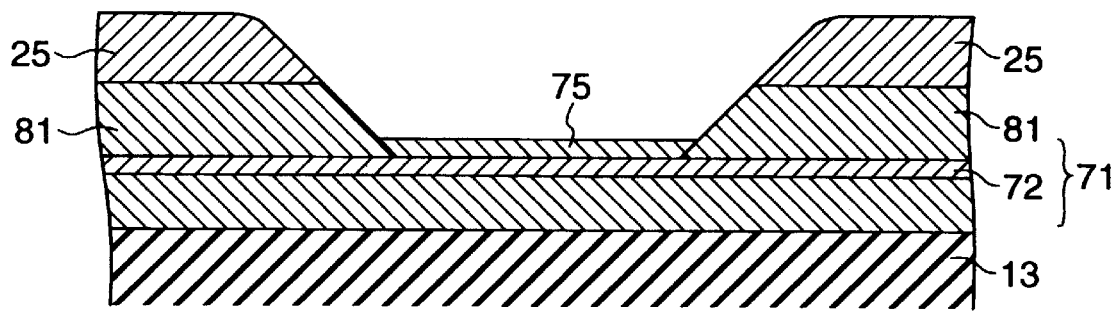
FIG. 38 is a sectional view of an essential portion showing another example of a structure where a fourth magneto-resistance effect element of the present invention is applied in a magneto-resistance effect head.

In the case of a GMR film 71 where a free layer 72 is disposed at the lower side, as shown in FIG. 37, it is desirable to employ an overlaid structure. In FIG. 37, numeral 82 is an under layer consisting of such as Ti, Ta and is formed in a film as demand arises. Thereon, a fcc under layer such as Cu can be formed in demand arises. Here, while a bias due to an antiferromagnetic layer 81 is used as a longitudinal bias, the hard magnetic layer 741 is magnetized in a direction nearly orthogonal to the bias direction of the antiferromagnetic layer 81 to realize an orthogonal magnetization arrangement. In the case of the GMR film 71 where the free layer 72 is disposed at the upper side, as shown in FIG. 38, it is preferable to employ an overlaid structure of the antiferromagnetic layer 81 as a hard magnetic biasing film. In the head structure shown in FIG. 38, the electrode 25 can be formed to overlap in part with the GMR film 71.

Figure 39:
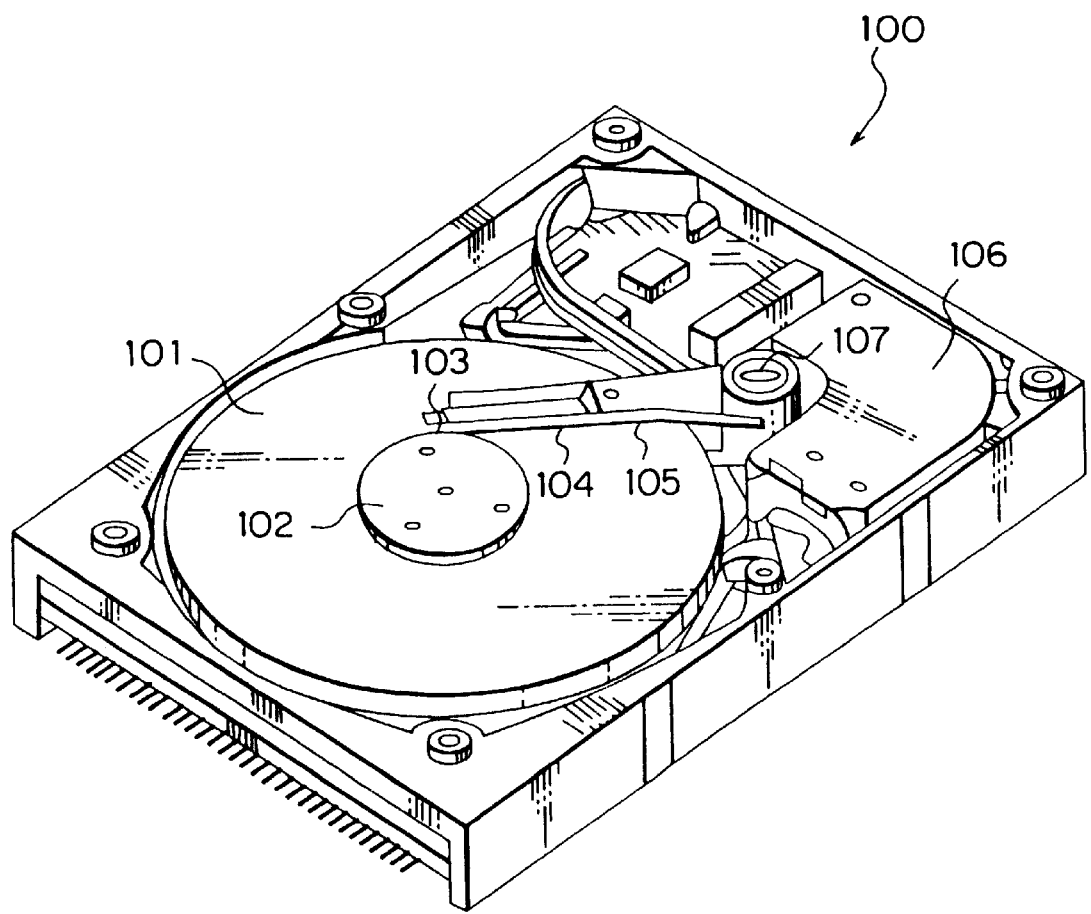
FIG. 39 is a perspective view showing one constitutional example of a magnetic disc unit using a magnetic head of the present invention.

The magnetic recording/read separation type head of the above described each embodiment is assembled in a head slider. A head slider equipped with a magnetic recording/read separation type head is mounted in a magnetic recording apparatus such as a magnetic disc device as shown in, for example, FIG. 39. FIG. 39 shows an outline structure of a magnetic disc device 100 employing a rotary actuator.

A magnetic disc 101 is fastened to a spindle 102 and is rotated by a motor (not shown in the figure) which responds to a control signal from a drive unit controller (not shown in the figure). A head slider 103 which executes recording/read of information while levitating from the magnetic disc 101 is fastened to a tip end of a thin film suspension 104.

When the magnetic disc 101 rotates, an air bearing surface (ABS) of the head slider 103 is held with a predetermined levitation quantity (0 nm to 100 nm or less) from a surface of the magnetic disc 101. The head slider 103 is provided with one magnetic recording/read separation type head of the above described embodiments.

A suspension 104 is connected to one edge of an actuator arm 105 having a bobbin portion which holds a not shown drive coil. At the other edge of the actuator arm 105, a voice coil motor 106, one kind of a linear motor, is disposed. The voice coil motor 106 is made up of a not shown drive coil wound up to the bobbin portion of the actuator arm 105 and a magnetic circuit consisting of a permanent magnet and an opposed yoke both of which are disposed to sandwich the drive coil.

The actuator arm 105 is held by not shown ball bearings disposed at 2 places of above and below a fixed axis 107 to be made freely rotatable/slidable by the voice coil motor 106.

Though, in the above embodiments, the magnetic recording/read separation type heads were described, a magneto-resistance effect element of the present invention can be applied also to the other head structure such as a magnetic recording/read combination type head in which a magnetic yoke is used in common in a recording head and a read head.

Figure 40:
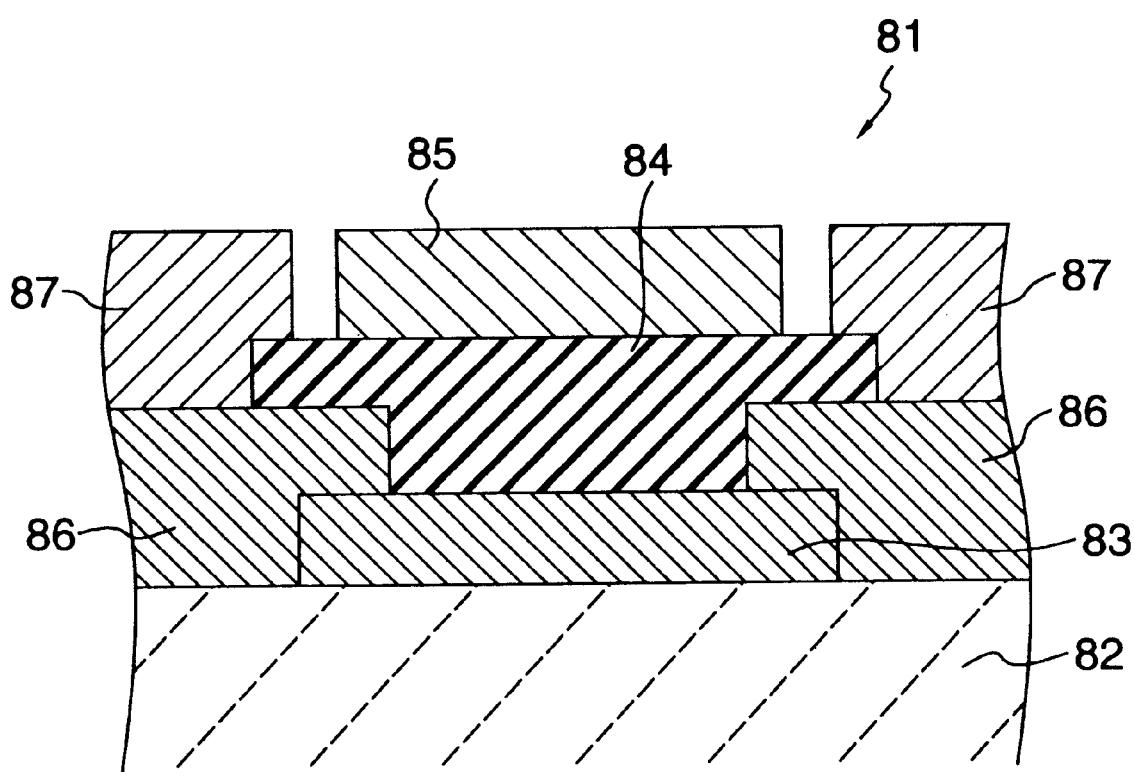
FIG. 40 is a sectional view showing a structure of one embodiment in which a magneto-resistance effect element of the present invention is applied in an MRAM.

A magneto-resistance effect element of the present invention can be applied not limiting to a magnetic head but also to a magnetic memory device such as a magneto-resistance effect memory (MRAM). FIG. 40 is a diagram showing constitution of one embodiment of an MRAM employing a giant magneto-resistance effect (GMR). An MRAM 81 shown in the figure possesses a spin valve GMR film 83 formed on a substrate 82 such as a glass substrate or a Si substrate. Specific constitutions of the spin valve GMR film 83 are as shown in FIG. 31 through FIG. 36.

At the upper portion of the spin valve GMR film 83, a write electrode 85 is disposed through an insulation layer 84. On both edge portions of the spin valve GMR film 83, a pair of read electrodes 86 are disposed. To the spin valve GMR film 83, a sense current is supplied from a pair of the read electrodes 86. Here, numeral 87 in the figure shows a pair of auxiliary electrodes.

Figure 41A:
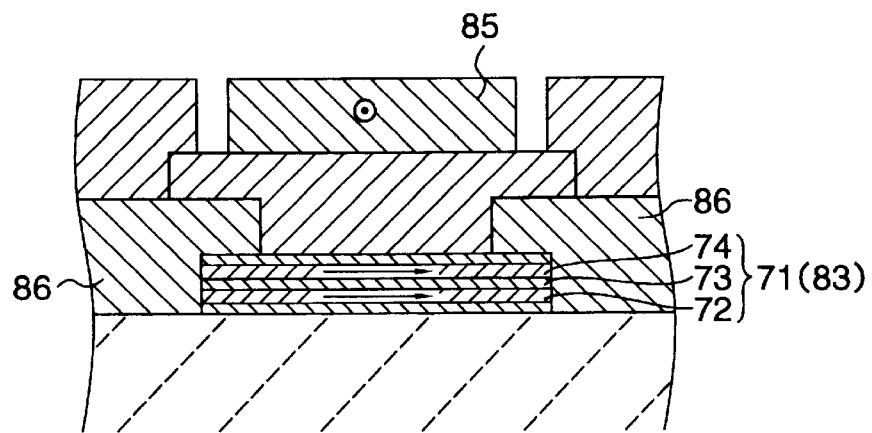
FIG. 41A, FIG. 41B and FIG. 41C are diagrams for explaining regenerative states of an MRAM shown in FIG. 40.
Figure 41B:
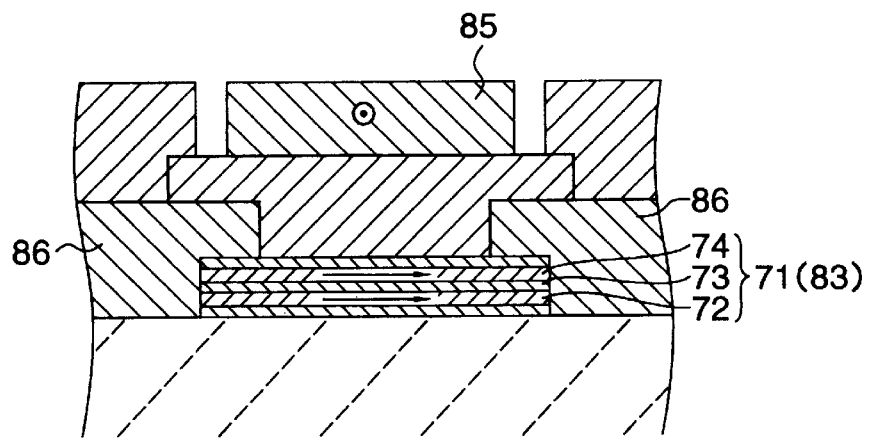
Figure 41C:
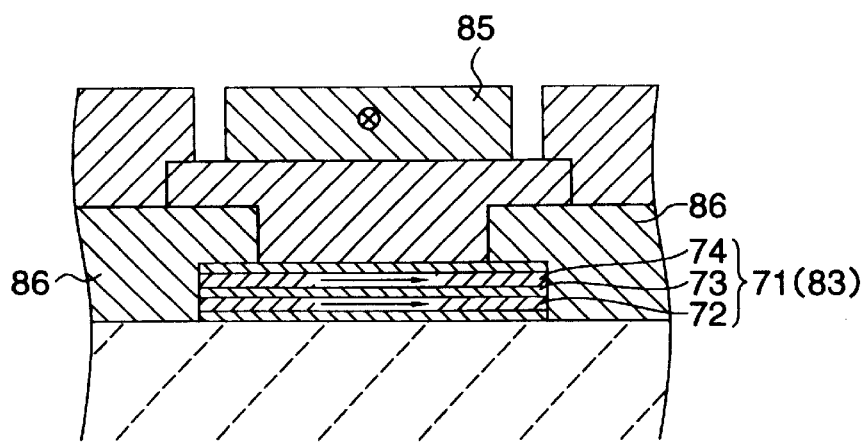

Writing and reading of information in the above described MRAM 81 is executed in the following manner, for example. With reference to FIG. 41A, FIG. 41B and FIG. 41C, recording and reading of information to and from the MRAM 81 will be described. Here, an MRAM 81 shown in FIG. 41A, FIG. 41B and FIG. 41C has a spin valve GMR film 71 shown in FIG. 31 as a spin valve GMR film 83. Since coercive force of a stacked film 74 can be easily controlled as described above, it can be effectively used as a semi-hard type information memory layer.

Writing of information is executed, as shown in FIG. 41A, by flowing an electric current to a write electrode 85 to input an external magnetic field to change the magnetization direction of a stacked film (semi-hard layer) 74 of a non-hard magnetic layer such as an FeCo alloy layer and a Co based hard magnetic layer to a direction corresponding to "1" or "0".

Reading of information is executed, as shown in FIG. 41B and FIG. 41C, while keeping flowing a sense current from the read electrodes 86, by flowing a pulse electric current of plus and minus sign to the write electrode 85 to reverse thereby the magnetization direction of a free layer 72, being a soft magnetic layer. Whether the write electrode 85 is plus or minus does not influence the magnetization direction of the free layer 72 and that is constant whether "1" or "0" of the semi-hard layer 74. On the contrary, depending on the magnetization direction of the semi-hard layer 74 memorized as "1" or "0", whether, when the pulse current of the write electrode 85 is plus, the magnetization directions of the ferromagnetic layers (72,74) above and below the spin valve GMR film 71 are parallel and when being minus, anti-parallel, or, when the pulse current of the write electrode 85 is minus, the magnetization direction is parallel and when being plus, anti-parallel, is determined. Therefore, when a pulse current of, for example, plus-minus is flowed to the write electrode 85, depending on whether resistance of the sense current is large→small or small→large, "1" or "0" of the semi-hard layer 74 can be distinguished.

In the above described MRAM 81, since a stacked film (semi-hard layer) 74 of a non-hard magnetic layer consisting of such as an FeCo alloy layer and a Co based hard magnetic layer has a high squareness ratio (=Mr/Ms), its properties as a memory layer is excellent and, by its state of "1" or "0", reverse direction recording can be executed nearly completely.

Further, an MRAM employing a conventional hard magnetic layer as a memory layer is largely influenced by a ferromagnetic coupling of the spin valve GMR film. Thereby, when a pulse current of plus or minus is flowed to the write electrode 85, adversely affected on movement of the magnetization direction of the free layer 72 to have made difficult to materialize complete one direction magnetization. On the contrary, a spin valve GMR film 71 according to the present invention, as described previously, since the influence of the ferromagnetic coupling is remarkably reduced, the complete one direction magnetization can be materialized.

In addition, in an MRAM employing a conventional hard magnetic layer as a memory layer, if a thickness of a non-magnetic layer is increased to eliminate influence of the ferromagnetic coupling, MR change rate decreases to induce lowering of S/N.

Figure 42:
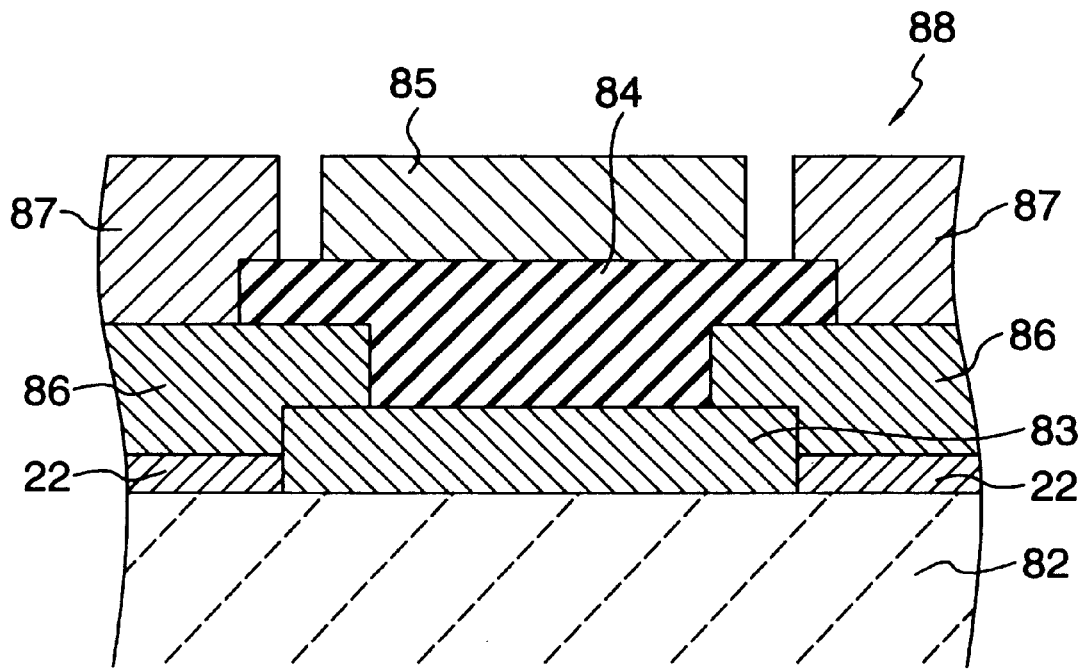
FIG. 42 is a sectional view showing a structure of another embodiment in which a magneto-resistance effect element of the present invention is applied to an MRAM.
Figure 43:
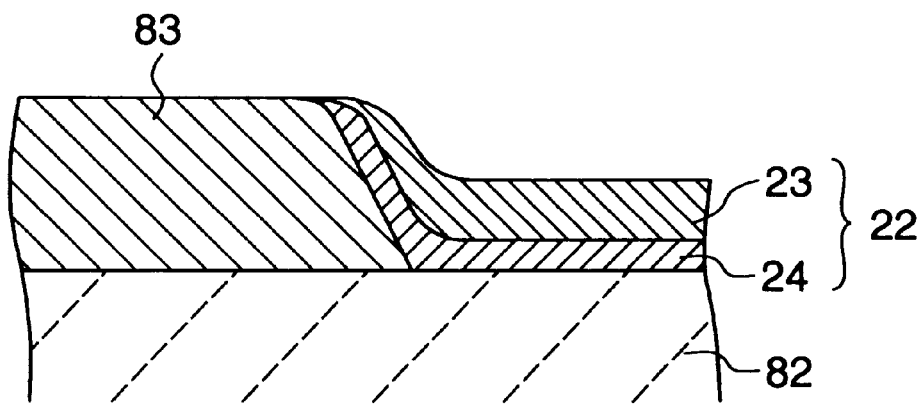
FIG. 43 is a sectional view showing in an exploding manner an essential portion of an MRAM shown in FIG. 42.
Figure 44:
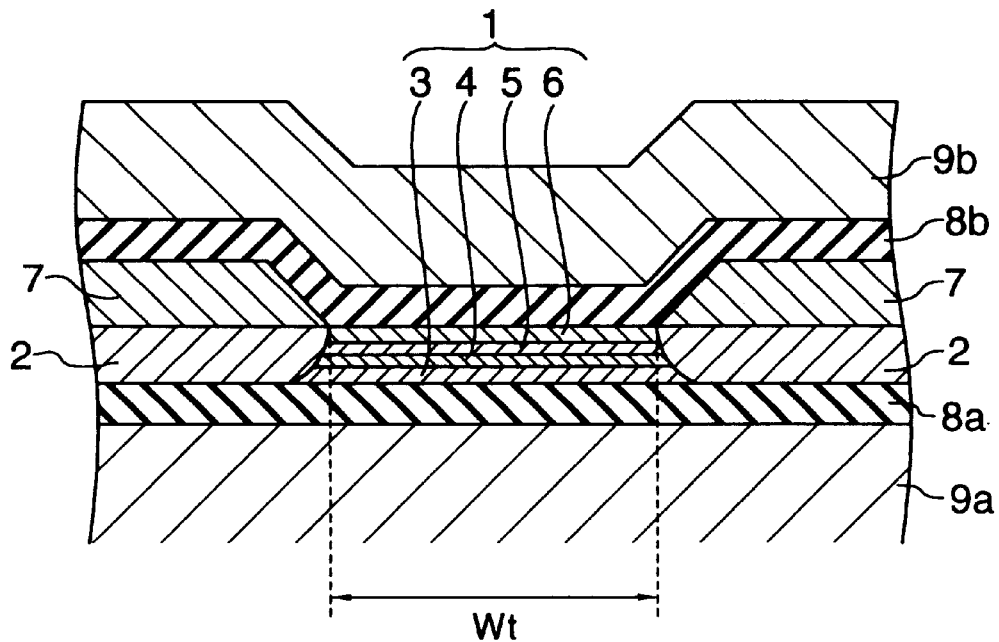
FIG. 44 is a sectional view showing a constitutional example of a magneto-resistance effect head of a conventional abutted junction type structure.
Figure 45:
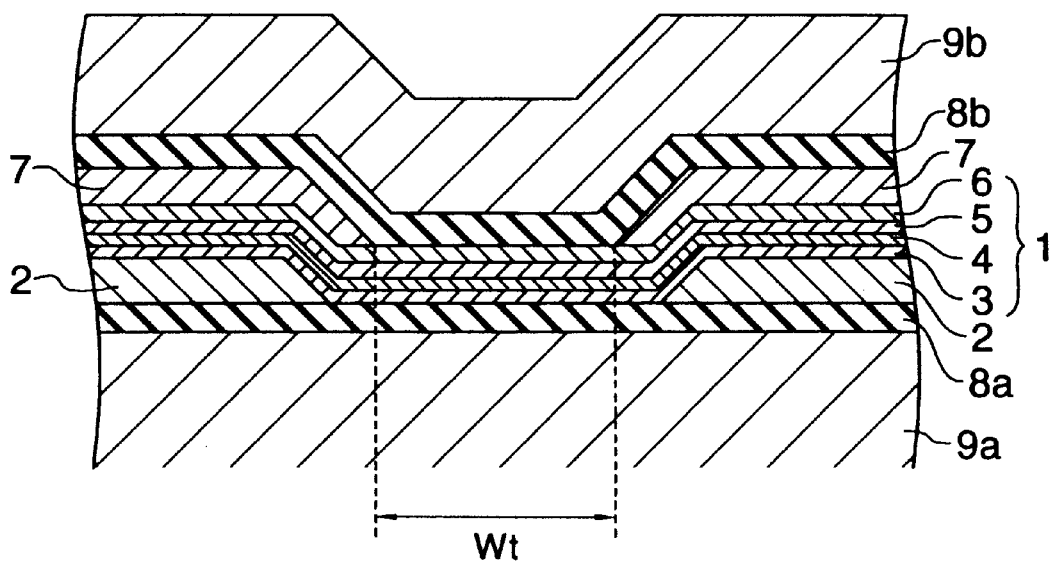
FIG. 45 is a sectional view showing a constitutional example of a magneto-resistance effect element of a conventional overlaid structure.

FIG. 42 is a sectional view showing other constitutional example of an MRAM. An MRAM 88 shown in the figure, as identical as the GMR head of the above described each embodiment, has a hard magnetic biasing film 22 for inputting a bias magnetic field to the free layer. As a specific constitution of a hard magnetic biasing film 22, as shown in, for example, FIG. 43, a film stacked a Co based hard magnetic layer 23 consisting of such as a CoPt alloy or a CoCrPt alloy on a high Ms magnetic layer 24 consisting of such as an FeCo alloy can be cited. Further, for a hard magnetic biasing layer 22, depending on the constitution of the spin valve GMR film 83, various structures of stacked films can be used.

A hard magnetic biasing film 22 in an MRAM 88 is to control a degree of the magnetic field where reversal of the magnetization of the free layer 72 occurs when a pulse current of plus or minus is flowed to the write electrode 85 or to suppress noise accompanying an irregular magnetization reversal in a state where magnetic domain is formed. Here, a hard magnetic biasing film is a thin film corresponding to a higher integration and it is important to obtain a bias force sufficient to suppress increase of a demagnetization field accompanying miniaturization of a cell size. As described in detail in each embodiment, a hard magnetic biasing film 22 consisting of a high Ms magnetic layer 24 and a hard magnetic layer 23 can endow a sufficient bias magnetic field. Therefore, an MRAM 88 enables to obtain a high integration.

What is claimed is:

1. A magneto-resistance effect element, comprising:
   a magneto-resistance effect film having a pinned layer, a non-magnetic layer stacked on the pinned layer thereabove, and a free layer stacked on the non-magnetic layer thereabove and varying its magnetization direction by an external magnetic field;
   a magnetic biasing film providing a bias magnetic field to the free layer, wherein the magnetic biasing film has a stacked film of a hard magnetic layer and a high saturation magnetization magnetic layer, and, when saturation magnetization of the high saturation magnetization magnetic layer is $Ms^{high}$, saturation magnetization of the free layer is $Ms^{free}$, saturation magnetization of the hard magnetic layer is $Ms^{hard}$, the high saturation magnetization magnetic layer satisfies at least one of $Ms^{high} \geq Ms^{free}$ and $Ms^{high} \geq Ms^{hard}$; and
   an electrode providing a sense current to the magneto-resistance effect film.

2. The magneto-resistance effect element as set forth in claim 1:
   wherein, the hard magnetic layer is stacked on the high saturation magnetization magnetic layer.

3. The magneto-resistance effect element as set forth in claim 2:
   wherein, the free layer has passive end regions separated by a central active region and the hard magnetic layer forms an abutted junction with the passive end regions of the free layer through the high saturation magnetization magnetic layer.

4. The magneto-resistance effect element as set forth in claim 1:
   wherein, the free layer has passive end regions separated by a central active region and the passive end region is stacked on the magnetic biasing film.

5. The magneto-resistance effect element as set forth in claim 1:
   wherein, the saturation magnetization $Ms^{high}$ of the high saturation magnetization magnetic layer is 1000 emu/cc or more.

6. The magneto-resistance effect element as set forth in claim 1:
   wherein, the free layer has a magnetic layer containing Co.

7. The magneto-resistance effect element as set force in claim 1:
   wherein, the high saturation magnetization magnetic layer comprises an FeCo alloy.

8. The magneto-resistance effect element as set forth in claim 1:
   wherein, the hard magnetic layer and the high saturation magnetization magnetic layer, when a thickness of the hard magnetic layer is $t^{hard}$ and a thickness of the high saturation magnetization magnetic layer is $t^{high}$, satisfy a relationship of $Ms^{hard} \times t^{hard} \geq Ms^{high} \times t^{high}$.

9. The magneto-resistance effect element as set forth in claim 1:
   wherein, the magnetic biasing film has a second high saturation magnetization magnetic layer, the second high saturation magnetization magnetic layer is disposed nearer to the free layer than the first saturation magnetization magnetic layer is.

10. A magnetic head, comprising:
    a lower magnetic shield;
    a magneto-resistance effect element formed on the lower magnetic shield through a lower read magnetic gap, the magneto-resistance effect element comprising
    a magneto-resistance effect film having a pinned layer, a non-magnetic layer stacked on the pinned layer thereabove, and a free layer stacked on the non-magnetic layer thereabove and varying its magnetization direction by an external magnetic field,
    a magnetic biasing film providing a bias magnetic field to the free layer, wherein the magnetic biasing film has a stacked film of a hard magnetic layer and a high saturation magnetization magnetic layer, and, when saturation magnetization of the high saturation magnetization magnetic layer is $Ms^{high}$, saturation of the free layer is $Ms^{free}$, saturation magnetization of the hard magnetic layer is $Ms^{hard}$, the high saturation magnetization magnetic layer satisfies at least one of $Ms^{high} \geq Ms^{free}$ and $Ms^{high} \geq Ms^{hard}$, and
    an electrode providing a sense current to the magneto-resistance effect film; and
    an upper magnetic shield formed on the magneto-resistance effect element through an upper read magnetic gap.

11. The magnetic head as set forth in claim 10, further comprising:
    a lower magnetic pole and the upper magnetic shield being one body;
    a read magnetic gap formed on the lower magnetic pole; and
    an upper magnetic pole disposed on the read magnetic gap.

12. A magnetic recording apparatus, comprising:
    a magnetic recording medium; and
    a head slider equipped with a magnetic head as set forth in claim 11 which writes signal to the magnetic recording medium through a magnetic field and reads signal through magnetic field generating from the magnetic recording medium, the magnetic head comprising
    a lower magnetic shield,
    a magneto-resistance effect element formed on the lower magnetic shield through a lower read magnetic gap, the magneto-resistance effect element comprising
    a magneto-resistance effect film having a pinned layer, a non-magnetic layer stacked on the pinned layer thereabove, and a free layer stacked on the non-magnetic layer thereabove and varying its magnetization direction by an external magnetic field, a magnetic biasing film providing a bias magnetic field to the free layer, wherein the magnetic biasing film has a stacked film of a hard magnetic layer and a high saturation magnetization magnetic layer, and, when saturation magnetization of the high saturation magnetization magnetic layer is $Ms^{high}$, saturation magnetization of the free layer is $Ms^{free}$, saturation magnetization of the hard magnetic layer is $Ms^{hard}$, the high saturation magnetization magnetic layer satisfies at least one of $Ms^{high} \geq Ms^{free}$ and $Ms^{high} \geq Ms^{hard}$, and an electrode providing a sense current to the magneto-resistance effect film, an upper magnetic shield formed on the magneto-resistance effect element through an upper read magnetic gap, a lower magnetic pole being one body with the upper magnetic shield, a read magnetic gap formed on the lower magnetic pole, and an upper magnetic pole disposed on the read magnetic gap.

13. A magneto-resistance effect element, comprising:

a magneto-resistance effect film which has a magnetic multi-layered film comprising a plurality of magnetic layers and a plurality of non-magnetic layers each disposed between the plurality of magnetic layers, at least one layer among the plurality of magnetic layers being a free layer of which magnetization direction varies according to an external magnetic field, and at least one layer among the plurality of magnetic layers being a pinned layer;

a magnetic biasing film providing a bias magnetic field to the free layer, wherein the magnetic biasing film has a stacked film of a hard magnetic layer and a high saturation magnetization magnetic layer, and, when saturation magnetization of the high saturation magnetization magnetic layer is $Ms^{high}$, saturation magnetization of the free layer is $Ms^{free}$, saturation magnetization of the hard magnetic layer is $Ms^{hard}$, the high saturation magnetization magnetic layer satisfies at least one of $Ms^{high} \geq Ms^{free}$ and $Ms^{high} \geq Ms^{hard}$; and an electrode providing a sense current to the magneto-resistance effect film.

14. The magneto-resistance effect element as set forth in claim 13:

wherein, a saturation magnetization $Ms^{high}$ of the high saturation magnetization magnetic layer is 1000 emu/cc or more.

15. The magneto-resistance effect element as set forth in claim 13:

wherein, the free layer has a magnetic layer containing Co.

16. The magneto-resistance effect element as set forth in claim 13:

wherein, the high saturation magnetization magnetic layer comprises an FeCo alloy.

17. The magneto-resistance effect element as set forth in claim 13:

wherein, the magneto-resistance effect film has a first pinned layer being the pinned layer, the free layer stacked on the first pinned layer through a first non-magnetic layer of the plurality of non-magnetic layers, and a second pinned layer being the pinned layer stacked on the free layer through a second non-magnetic layer of the plurality of non-magnetic layers.

18. The magneto-resistance effect element as set forth in claim 13:

wherein, the magneto-resistance effect element has a first free layer being the free layer, the pinned layer stacked on the first free layer through a first non-magnetic layer of the plurality of non-magnetic layers, and a second free layer being the free layer stacked on the pinned layer through a second non-magnetic layer of the plurality of non-magnetic layers.

19. The magneto-resistance effect element as set forth in claim 13:

wherein, the hard magnetic layer is stacked on the high saturation magnetization magnetic layer.

20. The magneto-resistance effect element as set forth in claim 19:

wherein, the magnetic biasing film has a plurality of high saturation magnetization magnetic layers, at least one layer of the plurality of high saturation magnetization magnetic layers is disposed nearer to the free layer than the rest of the plurality of high saturation magnetization magnetic layers.

21. A magneto-resistance effect element, comprising:

a magneto-resistance effect film having an anisotropic magneto-resistance effect layer and a soft magnetic layer, the soft magnetic layer being stacked with the anisotropic magneto-resistance effect layer through a non-magnetic layer and providing an operating point bias to the anisotropic magneto-resistance effect layer;

a magnetic biasing film providing a bias magnetic field to the anisotropic magneto-resistance effect layer or the soft magnetic layers, wherein the magnetic biasing film has a stacked film of a hard magnetic layer and a high saturation magnetization magnetic layer, and, when saturation magnetization of the high saturation magnetization magnetic layer is $Ms^{high}$, saturation magnetization of the magnetic layer which displays the anisotropic magneto-resistance effect layer is $Ms^{AMR}$, saturation magnetization of the hard magnetic layer is $Ms^{hard}$, the high saturation magnetization magnetic layer satisfies at least one of $Ms^{high} \geq Ms^{AMR}$ and $Ms^{high} \geq Ms^{hard}$; and an electrode providing a sense current to the magneto-resistance effect film.

* * * * *

UNITED STATES PATENT AND TRADEMARK OFFICE
CERTIFICATE OF CORRECTION

PATENT NO.: 6,118,624

DATED: September 12, 2000

INVENTOR(S): Hideaki Fukuzawa et al.

It is certified that an error appears in the above-identified patent and that said Letters Patent is hereby corrected as shown below:

Claim 7, column 28, line 1, change "force" to --forth--.

\* Claim 12, column 28, lines 56-57, after "magnetic head" delete "as set forth in claim 11".

\* Claim 21, column 30, lines 49-50, after "magnetization of" delete "the magnetic layer which displays".

Signed and Sealed this

Fifteenth Day of May, 2001

*Attest:*

NICHOLAS P. GODICI

*Attesting Officer*   Acting Director of the United States Patent and Trademark Office